US012720924B2

(12) United States Patent
Cho et al.

(10) Patent No.: US 12,720,924 B2
(45) Date of Patent: Aug. 25, 2026

(54) DISPLAY DEVICE AND METHOD OF MANUFACTURING THE SAME

(71) Applicant: Samsung Display Co., Ltd., Yongin-Si (KR)

(72) Inventors: Hyunmin Cho, Yongin-si (KR); Yunjong Yeo, Yongin-si (KR); Dawoon Jung, Yongin-si (KR); Jaehun Lee, Yongin-si (KR); Yang-Ho Jung, Yongin-si (KR); Yu-Gwang Jeong, Yongin-si (KR)

(73) Assignee: Samsung Display Co., Ltd., Yogin's (KR)

( * ) Notice: Subject to any disclaimer, the term of this patent is extended or adjusted under 35 U.S.C. 154(b) by 454 days.

(21) Appl. No.: 18/505,138

(22) Filed: Nov. 9, 2023

(65) Prior Publication Data

US 2024/0322083 A1 Sep. 26, 2024

(30) Foreign Application Priority Data

Mar. 22, 2023 (KR) ........................ 10-2023-0037476

(51) Int. Cl.

| | |
|---|---|
| ***H10K 50/86*** | (2023.01) |
| ***H10H 20/84*** | (2025.01) |
| ***H10W 90/00*** | (2026.01) |
| *H10H 20/01* | (2025.01) |

(52) U.S. Cl.
CPC ............ *H10H 20/84* (2025.01); *H10W 90/00* (2026.01); *H10H 20/034* (2025.01)

(58) Field of Classification Search
CPC ............................. H10K 50/86; H10K 50/865
USPC .................................................. 313/498–512
See application file for complete search history.

(56) References Cited

U.S. PATENT DOCUMENTS

| | | | | |
|---|---|---|---|---|
| 9,804,311 B2 | 10/2017 | Gaides et al. | | |
| 2002/0113550 A1* | 8/2002 | Nakamura | H04N 1/02845 | 313/506 |
| 2023/0130238 A1* | 4/2023 | Zhang | H10K 59/873 | 257/40 |
| 2023/0253525 A1* | 8/2023 | Lin | H10H 20/01 | 438/22 |
| 2024/0224692 A1* | 7/2024 | Kim | H10K 59/353 | |
| 2024/0224696 A1* | 7/2024 | Shim | H10K 59/127 | |
| 2024/0224697 A1* | 7/2024 | Hwang | H10K 50/858 | |
| 2024/0276853 A1* | 8/2024 | Lee | H10K 59/8792 | |

FOREIGN PATENT DOCUMENTS

| | | | |
|---|---|---|---|
| KR | 10-1830969 B1 | 2/2018 | |
| KR | 20240027188 A * | 3/2024 | H10K 50/85 |

* cited by examiner

*Primary Examiner* — Christopher M Raabe
(74) *Attorney, Agent, or Firm* — Innovation Counsel LLP

(57) ABSTRACT

A display device includes a substrate including a light-emitting area and a non-light-emitting area adjacent to the light-emitting area, a light-emitting element disposed in the light-emitting area on the substrate, a light blocking pattern disposed on the light-emitting element, and including first patterns extending in a first direction and spaced apart from each other and second patterns connected to the first patterns respectively and having a wider width than the first patterns in a plan view, and a transmission pattern surrounding the light blocking pattern.

20 Claims, 31 Drawing Sheets

DA
PX2
NLA
LA3
LA3-1
LA3-2
PX1
LA1
LA1-1
LA1-2
LA2
LA2-1
LA2-2
BP2
BP1
PX
PX1
PX2
BP
BP1
BP2
DR1
DR2

LD1 PE1 EL1 CE
LD2 PE2 EL2 CE
LD3 PE3 EL3 CE
BP
TP
TDL
TFE
CE
PDL
VIA
ILD
GI
BUF
SUB
I'
I
NLA
LA3-1
LA1-2
LA1-1
PE3
EL3
PE2
EL2
PE1
EL1
SE3 ACT3 GE3 DE3
TR3
SE2 ACT2 GE2 DE2
TR2
SE1 ACT1 GE1 DE1
TR1
DR1
DR2

LD1 PE1 EL1 CE
LD2 PE2 EL2 CE
LD3 PE3 EL3 CE
BP
TP
TDL
TFE
CE
PDL
VIA
ILD
GI
BUF
SUB
I'
I
NLA
LA3-1
LA1-2
LA1-1
EL3 PE3
EL2 PE2
EL1 PE1
SE3 ACT3 GE3 DE3
TR3
SE2 ACT2 GE2 DE2
TR2
SE1 ACT1 GE1 DE1
TR1
DR1
DR2

C
TP
OP
OP1
OP2
OP3
OP1
OP2
OP3
OP2
DR1
DR2

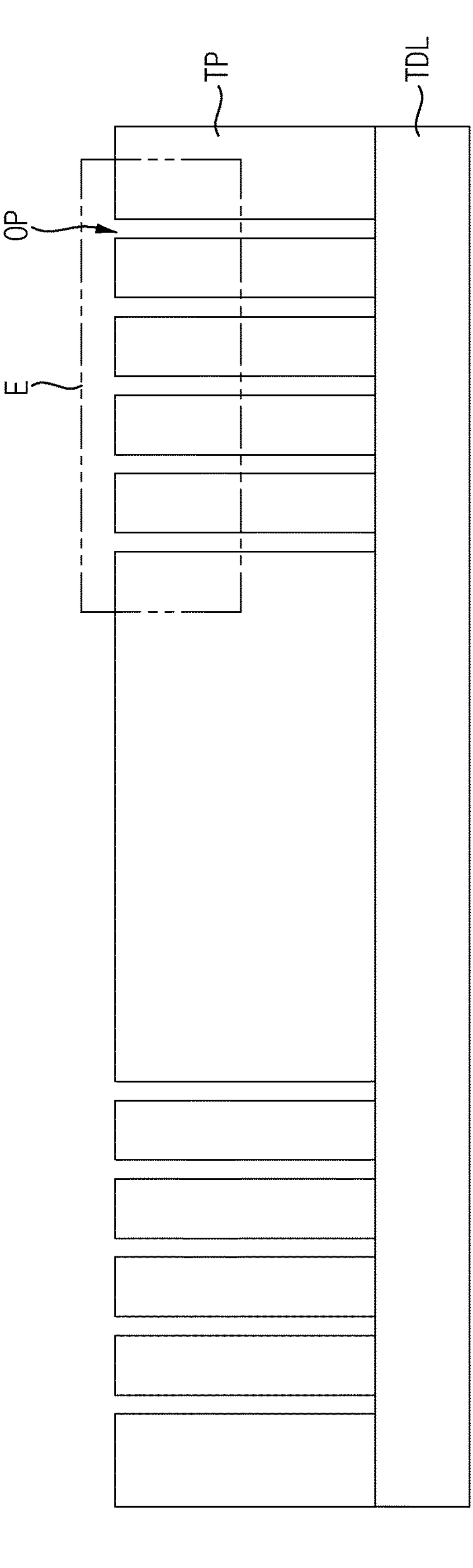
FIG. 26

DISPLAY DEVICE AND METHOD OF MANUFACTURING THE SAME

CROSS-REFERENCE TO RELATED APPLICATION(S)

This application claims priority under 35 USC § 119 to Korean Patent Application No. 10-2023-0037476 filed on Mar. 22, 2023, in the Korean Intellectual Property Office (KIPO), the entire disclosure of which is incorporated by reference herein.

BACKGROUND

1. Field

Embodiments relate to a display device. More specifically, embodiments relate to a display device capable of adjusting a viewing angle and a method of manufacturing the same.

2. Description of the Related Art

As information technology has developed, display devices, which are communication media between users and information, have become more important. Accordingly, display devices such as liquid crystal display devices, organic light-emitting display devices, plasma display devices, or the like have become widely used in various fields. In some cases, a display device may display an image that has a wide viewing angle. In other cases, a viewing angle of an image displayed on a display device may be limited in order to improve security or image reflection.

SUMMARY

Embodiments disclosed herein may provide a display device with improved process efficiency.

Embodiments disclosed herein may provide a method of manufacturing the display device.

A display device according to an embodiment of the present disclosure includes a substrate including a light-emitting area and a non-light-emitting area adjacent to the light-emitting area, a light-emitting element disposed in the light-emitting area on the substrate, a light blocking pattern disposed on the light-emitting element, and including first patterns extending in a first direction and spaced apart from each other and second patterns connected to the first patterns respectively and having a wider width than the first patterns in a plan view, and a transmission pattern surrounding the light blocking pattern.

In an embodiment, a height of an upper surface of the light blocking pattern may be equal to or lower than a height of an upper surface of the transmission pattern.

In an embodiment, the first patterns may overlap the light-emitting area and the non-light-emitting area.

In an embodiment, the second patterns may not overlap the light-emitting area and may overlap the non-light-emitting area.

In an embodiment, the light blocking pattern may further include third patterns extending in a second direction intersecting the first direction and connecting the first patterns to each other.

In an embodiment, the third patterns may overlap at least one of the light-emitting area and the non-light-emitting area.

In an embodiment, the light blocking pattern may further include third patterns extending in a second direction intersecting the first direction and connecting the second patterns to each other.

In an embodiment, the third patterns may not overlap the light-emitting area and may overlap the non-light-emitting area.

A method of manufacturing a display device according to an embodiment of the present disclosure includes forming a light-emitting element on a substrate including a light-emitting area and a non-light-emitting area adjacent to the light-emitting area, forming a transmission layer on the light-emitting element, patterning the transmission layer to form a transmission pattern including openings, and injecting a light blocking material into the openings through an inkjet process to form a light blocking pattern.

In an embodiment, a height of an upper surface of the light blocking pattern may be formed to be lower than or equal to a height of an upper surface of the transmission pattern.

In an embodiment, the openings may include first openings extending in a first direction and spaced apart from each other, and second openings connected to the first openings respectively and having a wider width than the first openings in a plan view.

In an embodiment, the light blocking material may be injected into the second openings.

In an embodiment, the light blocking material injected into the second openings may flow into the first openings.

In an embodiment, the first openings may be formed to overlap the light-emitting area and the non-light-emitting area.

In an embodiment, the second openings may be formed not to overlap the light-emitting area and to overlap the non-light-emitting area.

In an embodiment, the openings may further include third openings extending in a second direction intersecting the first direction and connecting the first openings to each other. The light blocking material injected into the second openings may flow into the first openings and the third openings.

In an embodiment, the third openings may be formed to overlap at least one of the light-emitting area and the non-light-emitting area.

In an embodiment, the openings may further include third openings extending in a second direction intersecting the first direction and connecting the second openings to each other. The light blocking material injected into the second openings may flow into the first openings and the third openings.

In an embodiment, the third openings may be formed not to overlap the light-emitting area and to overlap the non-light-emitting area.

In an embodiment, the patterning of the transmission layer may include forming a photoresist pattern on the transmission layer and etching the transmission layer through the photoresist pattern to form the transmission pattern.

In a display device according to embodiments of the present disclosure, the display device may include a light blocking pattern and a transmission pattern that control a viewing angle. The light blocking pattern may be formed through an inkjet process injecting a light blocking material. Accordingly, a height of an upper surface of the light blocking pattern may be adjusted. In addition, since a chemical mechanical polishing (CMP) process for forming the light blocking pattern may be omitted, efficiency of a manufacturing process of the display device may be improved.

BRIEF DESCRIPTION OF THE DRAWINGS

FIGS. 4, 5, 6, 7, 8, 9, 10, 11, and 12 are views illustrating a method of manufacturing the display device of FIG. 2.

FIGS. 24, 25, 26, 27, 28, 29, 30, and 31 are views illustrating a method of manufacturing of the display device of FIG. 23.

DETAILED DESCRIPTION OF THE EMBODIMENTS

Figure 1:
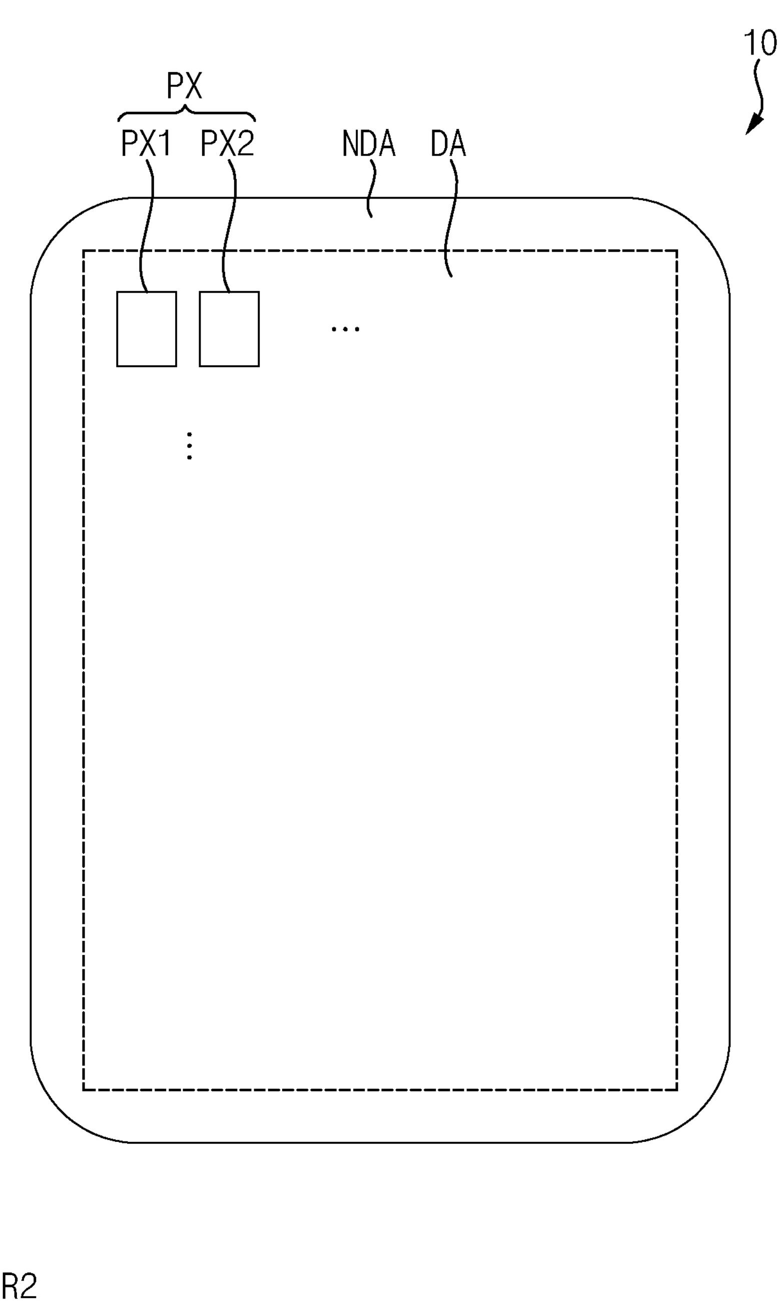
FIG. 1 is a plan view illustrating a display device according to an embodiment of the present disclosure.

Hereinafter, embodiments of the present disclosure will be described in more detail with reference to the accompanying drawings. The same reference numerals are used for the same components in the drawings, and redundant descriptions of the same components will be omitted.

FIG. 1 is a plan view illustrating a display device according to an embodiment of the present disclosure.

Referring to FIG. 1, a display device 10 may include a display area DA and a non-display area NDA.

The display area DA may be an area that displays an image. A plurality of pixels PX may be disposed in the display area DA. Each of the pixels PX may emit light. The pixels PX may include a first pixel PX1 and a second pixel PX2. For example, the first pixel PX1 and the second pixel PX2 may simultaneously emit light. Alternatively, when the first pixel PX1 emits light, the second pixel PX2 may not emit light. Alternatively, when the first pixel PX1 does not emit light, the second pixel PX2 may emit light. As each of the pixels PX emits light, the display area DA may display an image.

The pixels PX may be arranged in an array with columns of pixels PX extending along a first direction DR1 and rows of pixels PX extending along a second direction DR2 intersecting the first direction DR1 in a plan view. The second direction DR2 may be perpendicular to the first direction DR1. For example, the second pixel PX2 may be adjacent to the first pixel PX1 in the second direction DR2 and therefore in the same row as the first pixel PX1.

The non-display area NDA may be an area that does not display an image. The non-display area NDA may be positioned around the display area DA. For example, the non-display area NDA may surround the display area DA. Drivers or other circuits may be disposed in the non-display area NDA. The drivers may provide signals and/or voltages to the pixels PX. For example, the drivers may include a data driver, a gate driver, or the like.

Figure 2:
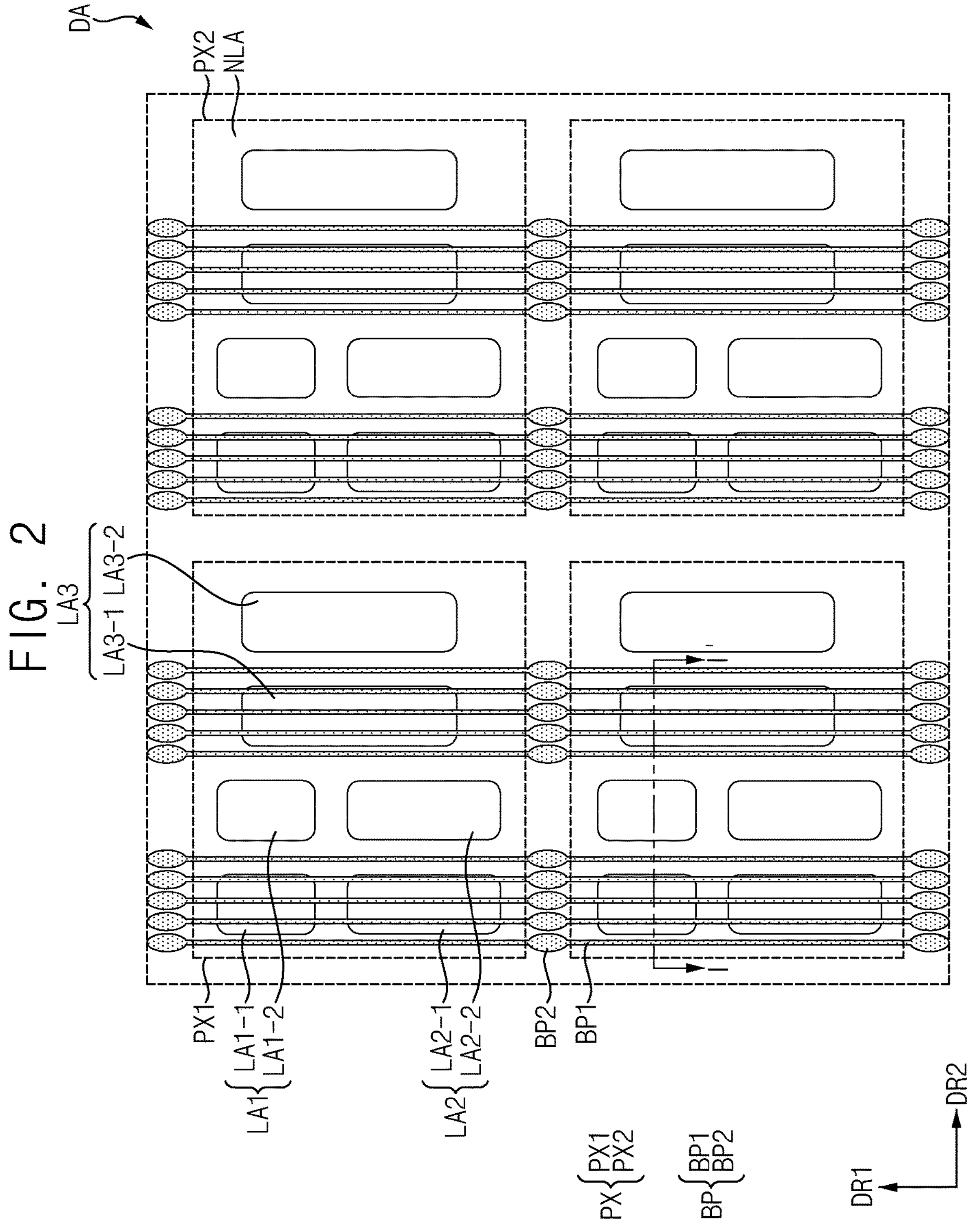
FIG. 2 is an enlarged plan view of a part of a display area of the display device of FIG. 1.

FIG. 2 is an enlarged plan view of a part of a display area of the display device of FIG. 1.

Referring to FIGS. 1 and 2, the display device 10 may include the pixels PX and a light blocking pattern BP disposed in the display area DA. For example, the blocking pattern BP may overlap the pixels PX and may particularly overlap pixels PX1 and PX2 as shown in FIG. 2.

The structure of the pixels PX shown in FIG. 2 may be repeated along the first direction DR1 and the second direction DR2 in the display area DA of the display device 10. For example, the pixels PX may include the first pixel PX1 and the second pixel PX2, which are adjacent to each other in a row extending along direction DR2.

Each of the pixels PX may include a first light-emitting area LA1, a second light-emitting area LA2, a third light-emitting area LA3 and a non-light-emitting area NLA. Each of the first light-emitting area LA1, the second light-emitting area LA2 and the third light-emitting area LA3 may be an area that emits light. The non-light-emitting area NLA may be an area that does not emit light.

In an embodiment, each of the first light-emitting area LA1, the second light-emitting area LA2 and the third light-emitting area LA3 may include two light-emitting areas adjacent to each other.

The first light-emitting area LA1 may include two separate light-emitting areas LA1-1 and LA1-2. For example, the light-emitting area LA1-2 may be adjacent to the light-emitting area LA1-1 in the second direction DR2. The second light-emitting area LA2 may include two separate light-emitting areas LA2-1 and LA2-2. For example, the light-emitting area LA2-2 may be adjacent to the light-emitting area LA2-1 in the second direction DR2. The third light-emitting area LA3 may include two separated light-emitting areas LA3-1 and LA3-2. For example, the light-emitting area LA3-2 may be adjacent to the light-emitting area LA3-1 in the second direction DR2.

In an embodiment, the first light-emitting area LA1 may emit light of a first color, the second light-emitting area LA2 may emit light of a second color, and the third light-emitting area LA3 may emit light of a third color. For example, the first color may be red, the second color may be green, and the third color may be blue. However, the present disclosure is not limited thereto. As the light of the first color, the light of the second color and the light of the third color are combined, each of the pixels PX may appear to emit light of various colors.

The light blocking pattern BP may include first patterns BP1 and second patterns BP2.

The first patterns BP1 may extend in the first direction DR1 and may be spaced apart from each other in the second direction DR2. The second patterns BP2 may be respectively connected to the first patterns BP1. The second patterns BP2 may be spaced apart from each other in the second direction DR2. In an embodiment, a width of each of the second patterns BP2 may be wider than a width of each of the first patterns BP1 in a plan view. Here, the width may be a length of each of the first patterns BP1 and the second patterns BP2 in the second direction DR2 in a plan view.

Although FIG. 2 illustrates that each of the second patterns BP2 have an elliptical planar shape, the present disclosure is not limited thereto. Each of the second patterns BP2 may have various planar shapes such as a polygonal shape, a circular shape, or the like. In addition, each of the second patterns BP2 may have various sizes.

The light blocking pattern BP may overlap the first, second and third light-emitting areas LA1, LA2 and LA3 and the non-light-emitting area NLA. Specifically, the first patterns BP1 may overlap the first, second and third light-emitting areas LA1, LA2 and LA3 and the non-light-emitting area NLA. In addition, the second patterns BP2 may not overlap the first, second and third light-emitting areas LA1, LA2 and LA3 and may overlap the non-light-emitting area NLA.

The first patterns BP1 may overlap one light-emitting area among two light-emitting areas included in each of the first, second and third light-emitting areas LA1, LA2 and LA3. For example, the first patterns BP1 may overlap the light-emitting area LA1-1, the light-emitting area LA2-1 and the light-emitting area LA3-1. In addition, the first patterns BP1 may not overlap any of the light-emitting area LA1-2, the light-emitting area LA2-2 and the light-emitting area LA3-2.

Figure 3:
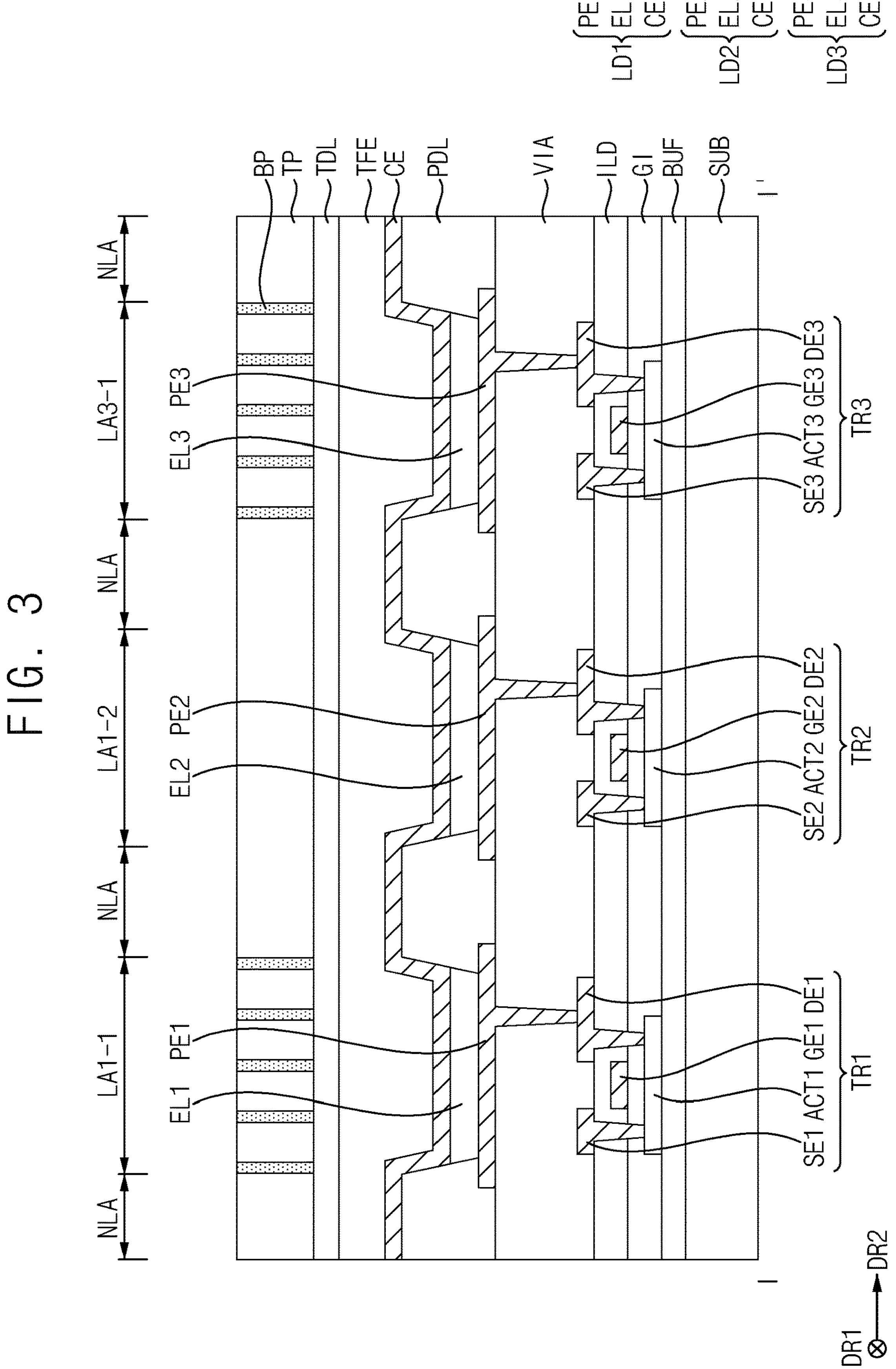
FIG. 3 is a cross-sectional view taken along line I-I' of FIG. 2.

FIG. 3 is a cross-sectional view of the display device 10 taken along line I-I' of FIG. 2.

Referring to FIG. 3, the display device 10 may include a substrate SUB, a buffer layer BUF, first, second and third transistors TR1, TR2 and TR3, a gate insulating layer GI, an interlayer insulating layer ILD, a via insulating layer VIA, first, second and third light-emitting elements LD1, LD2 and LD3, a pixel defining layer PDL, an encapsulation layer TFE, a touch sensing layer TDL, the light blocking pattern BP and a transmission pattern TP.

The first transistor TR1 may include a first active pattern ACT1, a first gate electrode GE1, a first source electrode SE1 and a first drain electrode DE1. The second transistor TR2 may include a second active pattern ACT2, a second gate electrode GE2, a second source electrode SE2 and a second drain electrode DE2. The third transistor TR3 may include a third active pattern ACT3, a third gate electrode GE3, a third source electrode SE3 and a third drain electrode DE3.

The first light-emitting element LD1 may include a first pixel electrode PE1, a first light-emitting layer EL1 and a common electrode CE. The second light-emitting element LD2 may include a second pixel electrode PE2, a second light-emitting layer EL2 and the common electrode CE. The third light-emitting element LD3 may include a third pixel electrode PE3, a third light-emitting layer EL3 and the common electrode CE.

The substrate SUB may include a transparent material or an opaque material. Examples of materials that may be used as the substrate SUB may include plastic, glass, quartz, or the like. These may be used alone or in combination with each other.

The buffer layer BUF may be disposed on the substrate SUB. The buffer layer BUF may prevent diffusion of metal atoms or impurities from the substrate SUB into the first, second and third transistors TR1, TR2 and TR3. The buffer layer BUF may control a heat supply or conduction rate during a crystallization process forming the first, second and third active patterns ACT1, ACT2 and ACT3. The buffer layer BUF may include an inorganic insulating material. Examples of inorganic insulating materials that may be used in the buffer layer BUF may include silicon oxide, silicon nitride, silicon oxynitride, or the like. These may be used alone or in combination with each other.

The first, second and third active patterns ACT1, ACT2 and ACT3 may be disposed on the buffer layer BUF. Each of the first, second and third active patterns ACT1, ACT2 and ACT3 may include a source area, a drain area and a channel area positioned between the source area and the drain area. The first, second and third active patterns ACT1, ACT2 and ACT3 may be formed through the same process and may include the same material.

Each of the first, second and third active patterns ACT1, ACT2 and ACT3 may include a silicon semiconductor material or an oxide semiconductor material. Examples of silicon semiconductor materials that may be used as each of the first, second and third active patterns ACT1, ACT2 and ACT3 may include amorphous silicon, polycrystalline silicon, or the like. Examples of oxide semiconductor materials that may be used as each of the first, second and third active patterns ACT1, ACT2 and ACT3 may include indium gallium zinc oxide (IGZO), indium tin zinc oxide (ITZO), or the like. These may be used alone or in combination with each other.

The gate insulating layer GI may be disposed on the first, second and third active patterns ACT1, ACT2 and ACT3. The gate insulating layer GI may cover the first, second and third active patterns ACT1, ACT2 and ACT3. The gate insulating layer GI may include an inorganic insulating material. Examples of inorganic insulating materials that may be used as the gate insulating layer GI may include silicon oxide, silicon nitride, silicon oxynitride, or the like. These may be used alone or in combination with each other.

The first, second and third gate electrodes GE1, GE2 and GE3 may be disposed on the gate insulating layer GI. The first gate electrode GE1 may overlap the channel area of the first active pattern ACT1, the second gate electrode GE2 may overlap the channel area of the second active pattern ACT2, and the third gate electrode GE3 may overlap the channel area of the third active pattern ACT3. The first, second and third gate electrodes GE1, GE2 and GE3 may be formed through the same process and may include the same material. Each of the first, second and third gate electrodes GE1, GE2 and GE3 may include a conductive material. Examples of conductive materials that may be used as each of the first, second and third gate electrodes GE1, GE2 and GE3 may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), or the like. These may be used alone or in combination with each other.

The interlayer insulating layer ILD may be disposed on the first, second and third gate electrodes GE1, GE2 and GE3. The interlayer insulating layer ILD may cover the first, second and third gate electrodes GE1, GE2 and GE3. The interlayer insulating layer ILD may include an inorganic insulating material. Examples of inorganic insulating materials that may be used as the interlayer insulating layer ILD may include silicon oxide, silicon nitride, silicon oxynitride, or the like. These may be used alone or in combination with each other.

The first, second and third source electrodes SE1, SE2 and SE3 may be disposed on the interlayer insulating layer ILD. The first source electrode SE1 may be connected to the source area of the first active pattern ACT1 through a contact hole penetrating the gate insulating layer GI and the interlayer insulating layer ILD. The second source electrode SE2 may be connected to the source area of the second active pattern ACT2 through a contact hole penetrating the gate insulating layer GI and the interlayer insulating layer ILD. The third source electrode SE3 may be connected to the source area of the third active pattern ACT3 through a contact hole penetrating the gate insulating layer GI and the interlayer insulating layer ILD.

The first, second and third drain electrodes DE1, DE2 and DE3 may be disposed on the interlayer insulating layer ILD. The first drain electrode DE1 may be connected to the drain area of the first active pattern ACT1 through a contact hole penetrating the gate insulating layer GI and the interlayer insulating layer ILD. The second drain electrode DE2 may be connected to the drain area of the second active pattern ACT2 through a contact hole penetrating the gate insulating layer GI and the interlayer insulating layer ILD. The third drain electrode DE3 may be connected to the drain area of the third active pattern ACT3 through a contact hole penetrating the gate insulating layer GI and the interlayer insulating layer ILD.

The first, second and third source electrodes SE1, SE2 and SE3 and the first, second and third drain electrodes DE1, DE2 and DE3 may be formed through the same process and may include the same material. Each of the first, second and third source electrodes SE1, SE2 and SE3 and the first, second and third drain electrodes DE1, DE2 and DE3 may include a conductive material. Examples of conductive materials that may be used as each of the first, second and third source electrodes SE1, SE2 and SE3 and the first, second and third drain electrodes DE1, DE2 and DE3 may include aluminum, platinum, palladium, silver, magnesium, gold, nickel, neodymium, iridium, chromium, lithium, calcium, molybdenum, titanium, tungsten, copper, or the like. These may be used alone or in combination with each other.

Accordingly, the first transistor TR1 including the first active pattern ACT1, the first gate electrode GE1, the first source electrode SE1 and the first drain electrode DE1 may be disposed on the substrate SUB. The second transistor TR2 including the second active pattern ACT2, the second gate electrode GE2, the second source electrode SE2 and the second drain electrode DE2 may be disposed on the substrate SUB. The third transistor TR3 including the third active pattern ACT3, the third gate electrode GE3, the third source electrode SE3 and the third drain electrode DE3 may be disposed on the substrate SUB.

The via insulating layer VIA may be disposed on the first, second and third source electrodes SE1, SE2 and SE3 and the first, second and third drain electrodes DE1, DE2 and DE3. The via insulating layer VIA may cover the first, second and third source electrodes SE1, SE2 and SE3 and the first, second and third drain electrodes DE1, DE2 and DE3. The via insulating layer VIA may include an organic insulating material. Examples of organic insulating materials that may be used in the via insulating layer VIA may include photoresist, polyacrylic resin, polyimide resin, acrylic resin, or the like. These may be used alone or in combination with each other.

The first, second and third pixel electrodes PE1, PE2 and PE3 may be disposed on the via insulating layer VIA. The first pixel electrode PE1 may overlap the light-emitting area LA1-1 and may be connected to the first drain electrode DE1 through a contact hole penetrating the via insulating layer VIA. The second pixel electrode PE2 may overlap the light-emitting area LA1-2 and may be connected to the second drain electrode DE2 through a contact hole penetrating the via insulating layer VIA. The third pixel electrode PE3 may overlap the light-emitting area LA3-1 and may be connected to the third drain electrode DE3 through a contact hole penetrating the via insulating layer VIA. For example, each of the first, second and third pixel electrodes PE1, PE2 and PE3 may operate as an anode.

The first, second and third pixel electrodes PE1, PE2 and PE3 may be formed through the same process and may include the same material. Each of the first, second and third pixel electrodes PE1, PE2 and PE3 may include a conductive material. Examples of conductive materials that may be used in each of the first, second and third pixel electrodes PE1, PE2 and PE3 may include aluminum, platinum, palladium, silver, magnesium, gold, nickel, neodymium, iridium, chromium, lithium, calcium, molybdenum, titanium, tungsten, copper, indium tin oxide, indium zinc oxide, or the like. These may be used alone or in combination with each other.

The pixel defining layer PDL may be disposed on the via insulating layer VIA. The pixel defining layer PDL may overlap the non-light-emitting area NLA. The pixel defining layer PDL may cover both sides of each of the first, second and third pixel electrodes PE1, PE2 and PE3. In addition, the pixel defining layer PDL may include openings respectively exposing portions of the upper surfaces of the first, second and third pixel electrodes PE1, PE2 and PE3. The pixel defining layer PDL may include an organic insulating material. Examples of organic insulating materials that may be used in the pixel defining layer PDL may include photoresist, polyacrylic resin, polyimide resin, acrylic resin, or the like. These may be used alone or in combination with each other.

The first light-emitting layer EL1 may be disposed on the first pixel electrode PE1, the second light-emitting layer EL2 may be disposed on the second pixel electrode PE2, and the third light-emitting layer EL3 may be disposed on the third pixel electrode PE3. Each of the first, second and third light-emitting layers EL1, EL2 and EL3 may include an organic material that emits light of a predetermined color. For example, each of the first light-emitting layer EL1 and the second light-emitting layer EL2 may include an organic material that emits red light, and the third light-emitting layer EL3 may include an organic material that emits blue light. However, the present disclosure is not limited thereto.

The common electrode CE may be disposed on the first, second and third light-emitting layers EL1, EL2 and EL3 and the pixel defining layer PDL. The common electrode CE may be a plate electrode. For example, the common electrode CE may operate as a cathode. The common electrode CE may include a conductive material. Examples of conductive materials that may be used as the common electrode CE may include aluminum, platinum, silver, magnesium, gold, chromium, tungsten, titanium, or the like. These may be used alone or in combination with each other.

Accordingly, the first light-emitting element LD1 including the first pixel electrode PE1, the first light-emitting layer EL1 and a portion of the common electrode CE may be disposed in the light-emitting area LA1-1 on the substrate SUB. The second light-emitting element LD2 including the second pixel electrode PE2, the second light-emitting layer EL2 and another portion of the common electrode CE may be disposed in the light-emitting area LA1-2 on the substrate SUB. The third light-emitting element LD3 including the third pixel electrode PE3, the third light-emitting layer EL3 and yet another portion of the common electrode CE may be disposed in the light-emitting area LA3-1 on the substrate SUB.

The encapsulation layer TFE may be disposed on the common electrode CE. The encapsulation layer TFE may prevent impurities, moisture, air, or the like from permeating the first, second and third light-emitting elements LD1, LD2 and LD3 from outside. In an embodiment, the encapsulation layer TFE may include at least one inorganic layer and at least one organic layer. For example, the organic layer and the inorganic layer may be alternately stacked. In another embodiment, the encapsulation layer TFE may be provided as an encapsulation substrate.

The touch sensing layer TDL may be disposed on the encapsulation layer TFE. The touch sensing layer TDL may include a touch inorganic layer and touch electrodes. The touch sensing layer TDL may function as an input structure of the display device 10.

The light blocking pattern BP may be disposed on the touch sensing layer TDL. The light blocking pattern BP may overlap the light-emitting area LA1-1, the light-emitting area LA3-1 and the non-light-emitting area NLA. In addition, the light blocking pattern BP may not overlap the light-emitting area LA1-2.

Light emitted from the first, second and third light-emitting elements LD1, LD2 and LD3 may be incident on the light blocking pattern BP, or may pass between regions of the light blocking pattern BP. Light incident on the light blocking pattern BP may be reflected from the light blocking pattern BP, may pass through the light blocking pattern BP, or may be absorbed by the light blocking pattern BP. In an embodiment, most of the light incident on the light blocking pattern BP may be absorbed by the light blocking pattern BP. Accordingly, the light blocking pattern BP may control or limit angles at which light from the first, second and third light-emitting elements LD1, LD2 and LD3 can be emitted from the display device 10 and thereby may control a viewing angle of the display device 10. The viewing angle here is the angle at which a viewer can view and see an acceptable image displayed by the display device 10.

In an embodiment, the light blocking pattern BP may include a black pigment or an organic material including a black dye. In another embodiment, the light blocking pattern BP may include molybdenum-tantalum oxide (MTO). For example, the light blocking pattern BP may have a single-layer structure or a multi-layer structure including MTO. However, the present disclosure is not limited thereto. For example, the light blocking pattern BP may include various materials having relatively low transmittance and reflectance and relatively high absorbance.

The transmission pattern TP may be disposed on the touch sensing layer TDL. The transmission pattern TP may surround the light blocking pattern BP. That is, the transmission pattern TP may overlap the light-emitting area LA1-1, the light-emitting area LA1-2, the light-emitting area LA3-1 and the non-light-emitting area NLA. Light emitted from the first, second and third light-emitting elements LD1, LD2 and LD3 may pass through the transmission pattern TP. The transmission pattern TP may include an organic material. In an embodiment, a height of an upper surface of the light blocking pattern BP may be the same as a height of an upper surface of the transmission pattern TP.

Figure 5:
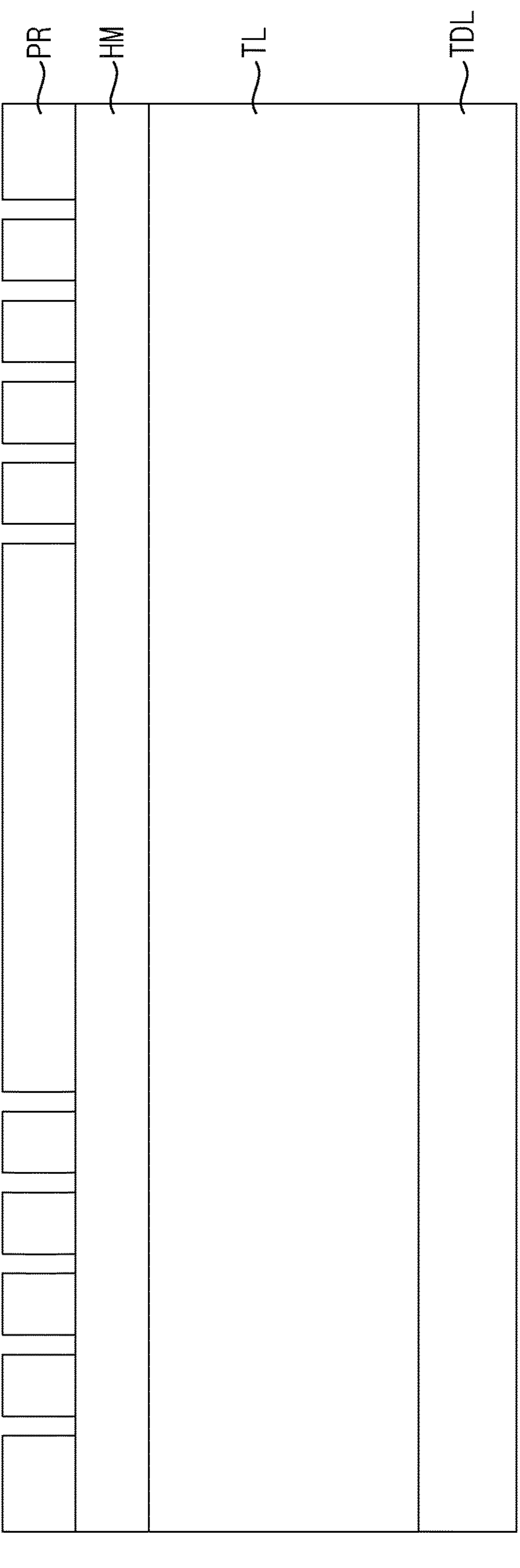
Figure 5:
Figure 6:
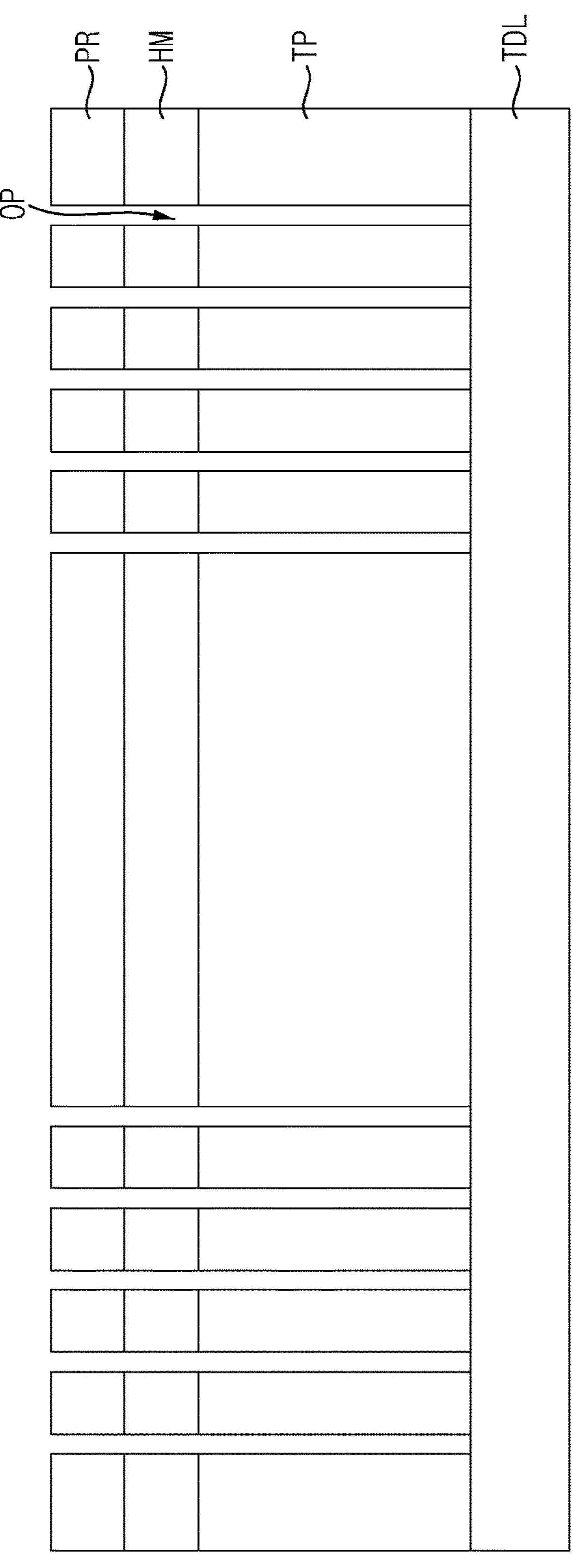
Figure 6:
Figure 7:
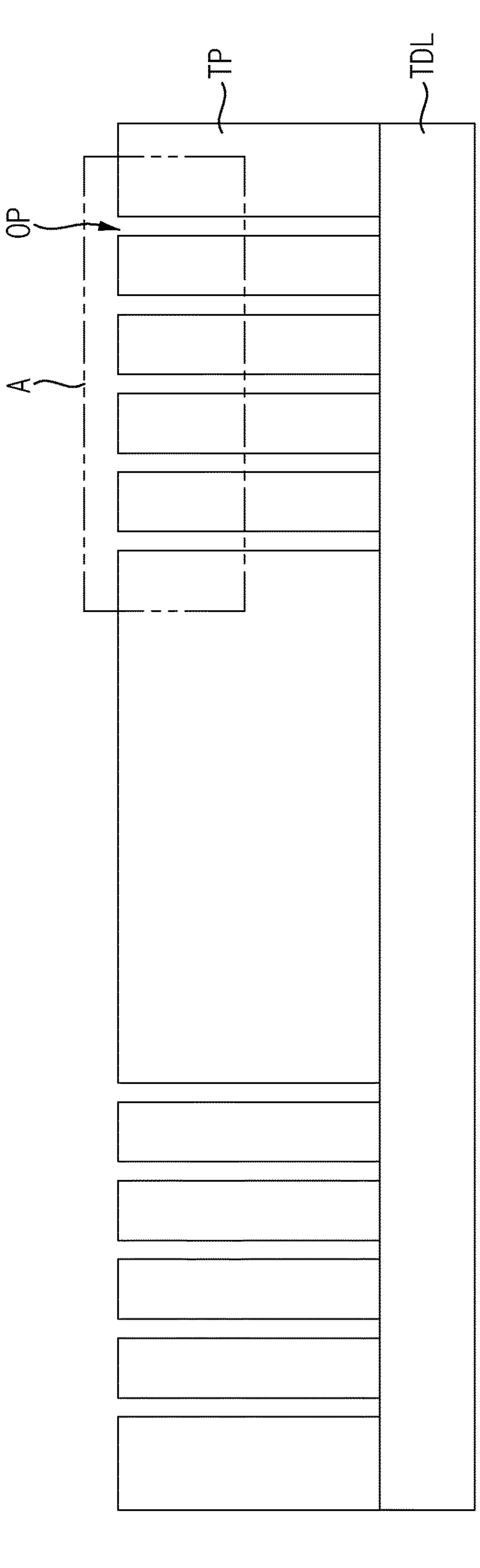
Figure 7:
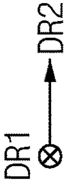
Figure 8:
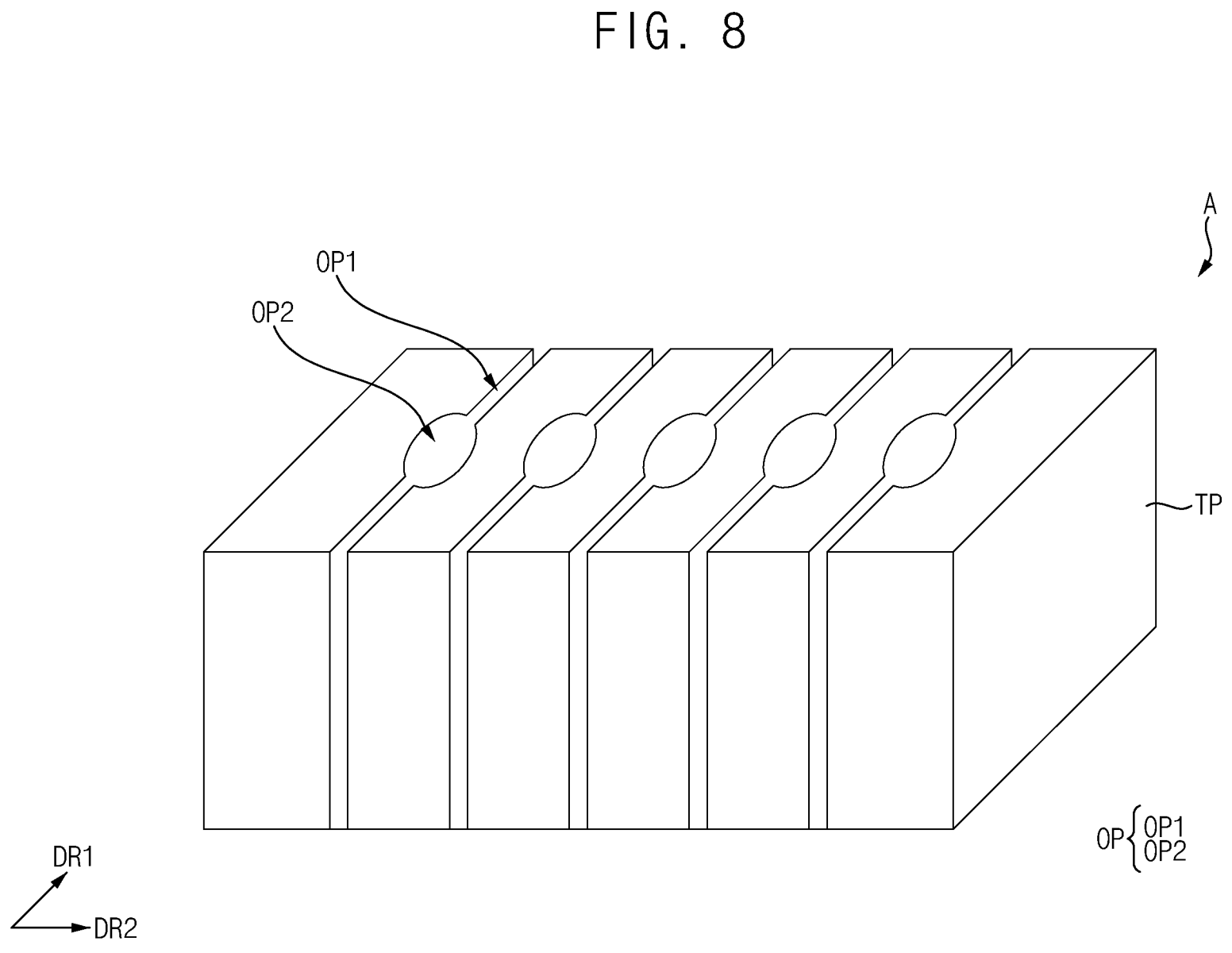
Figure 9:
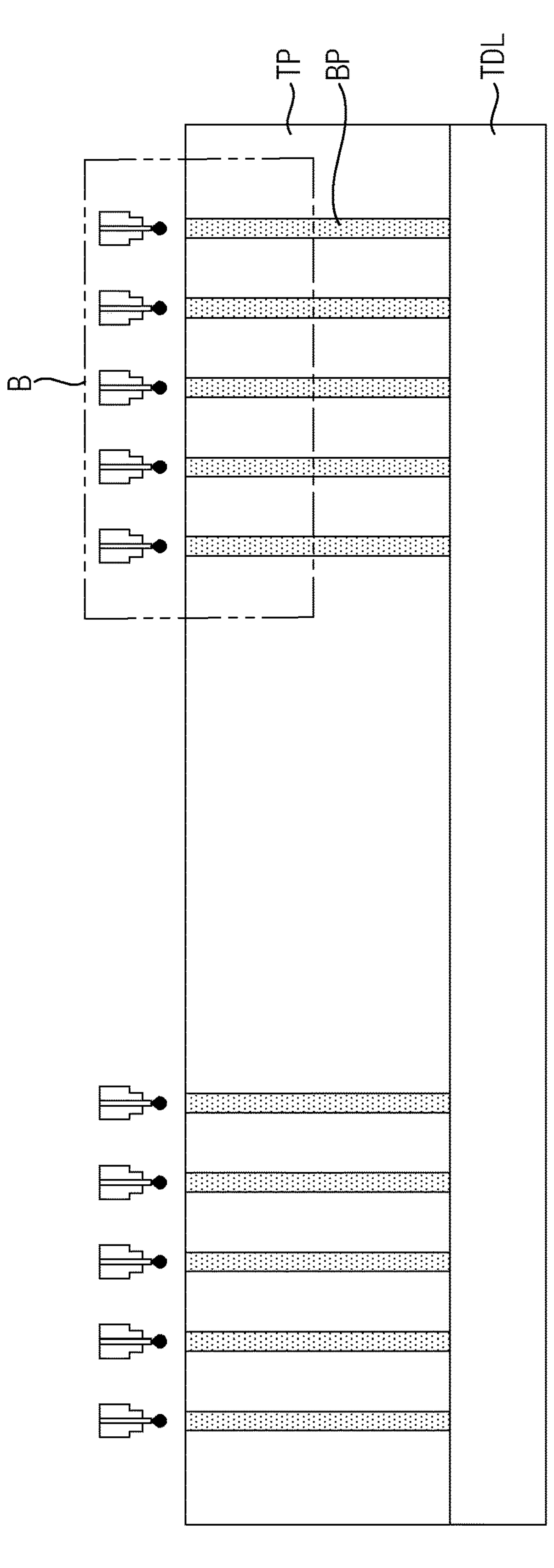
Figure 9:
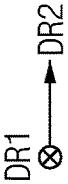
Figure 10:
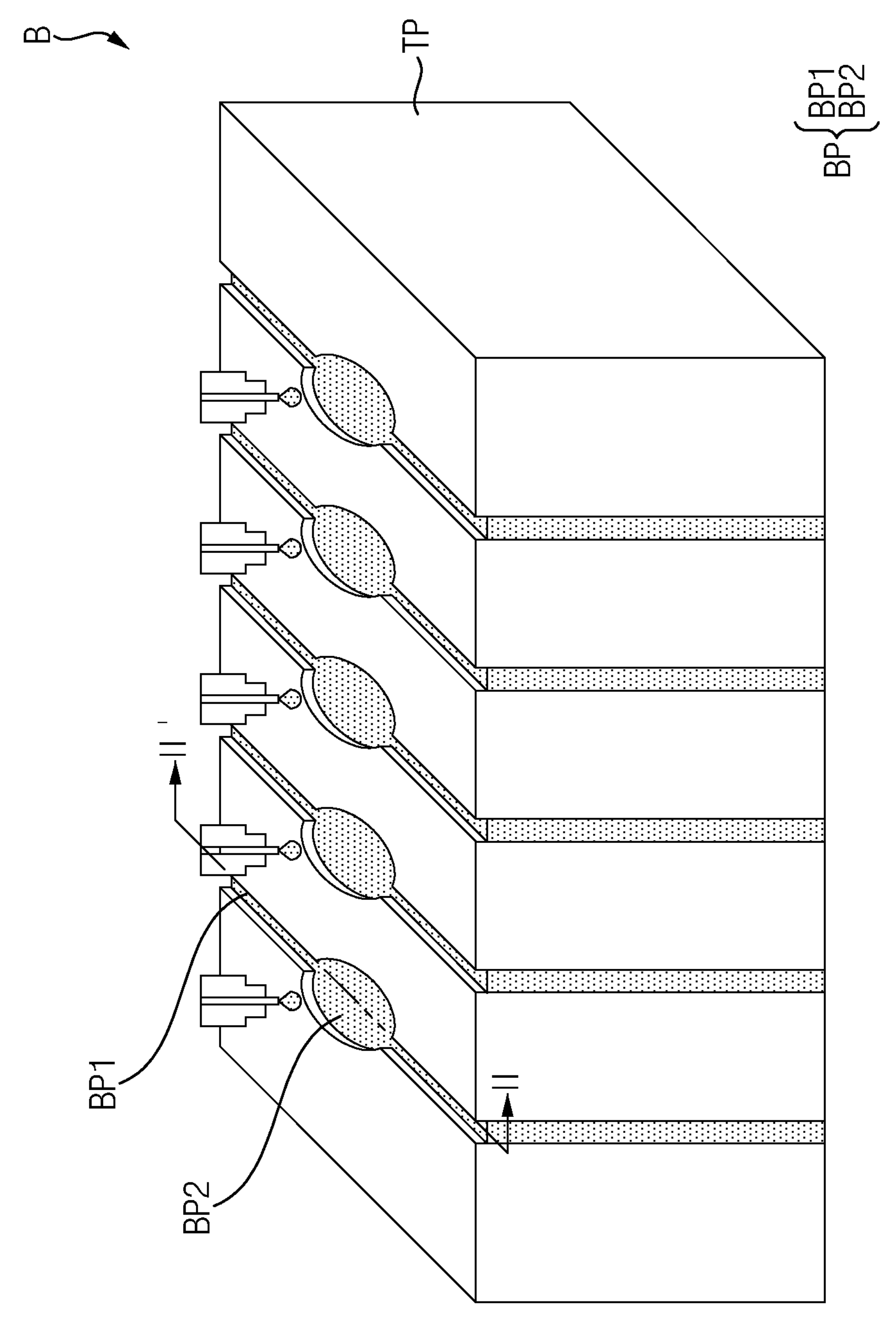
Figure 10:
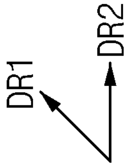
Figure 11:
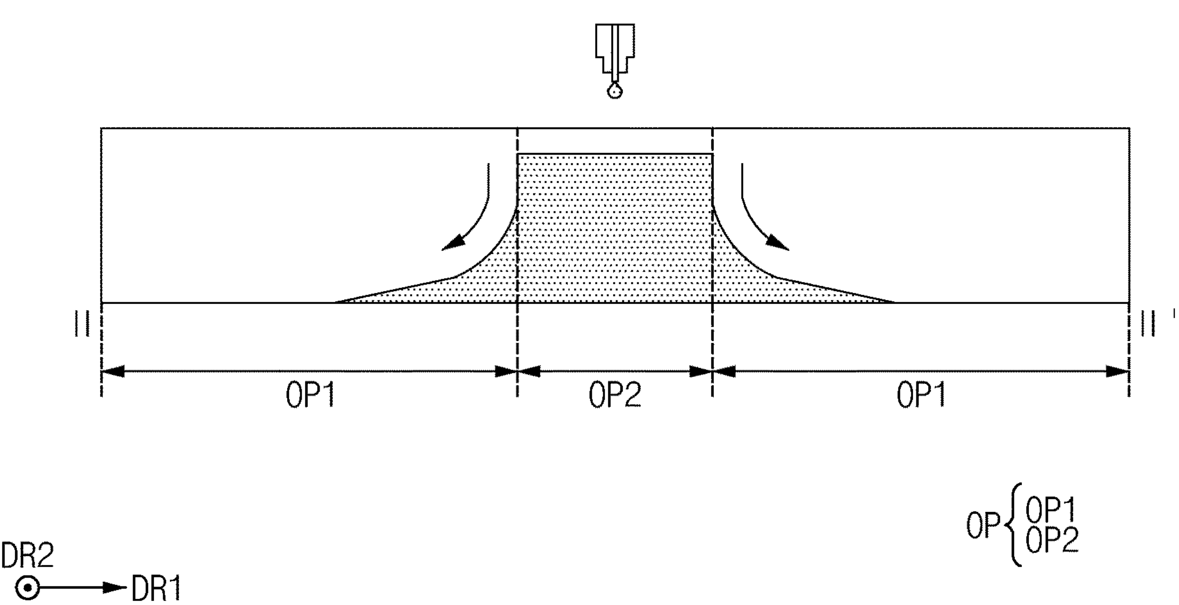

FIGS. 4 to 12 show structures that may be formed during a method of manufacturing the display device of FIG. 2. Among the structures illustrated in FIGS. 4 to 12, FIG. 8 shows an enlarged perspective view of an area A of FIG. 7, FIG. 10 shows an enlarged perspective view of an area B of FIG. 9, and FIG. 11 shows a cross-sectional view taken along line II-II' of FIG. 10 during formation of the blocking pattern BP.

Figure 4:
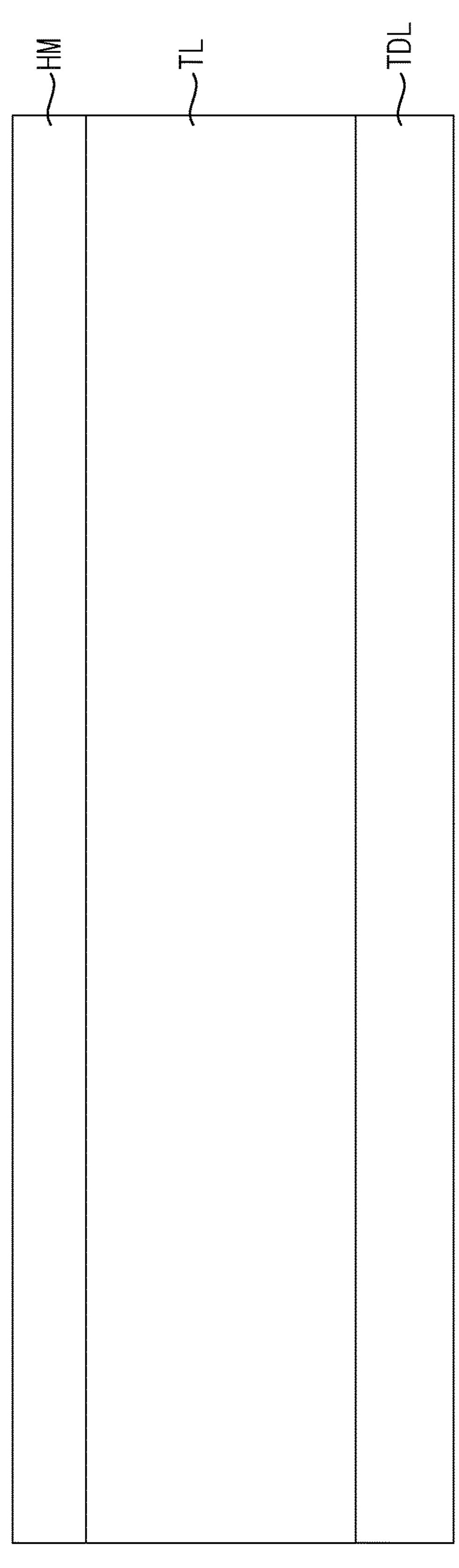
Figure 4:

Referring to FIGS. 4 and 5, a transmission layer TL and a hard mask HM may be sequentially formed on the touch sensing layer TDL. The transmission layer TL may include an organic material. A photoresist pattern PR may be formed on the hard mask HM.

Referring to FIGS. 5 and 6, the transmission layer TL and the hard mask HM may be patterned through the photoresist pattern PR. For example, exposed areas of the transmission layer TL and the hard mask HM may be collectively etched through the photoresist pattern PR.

As the transmission layer TL is etched through the photoresist pattern PR, the transmission pattern TP, which overlaps the photoresist pattern PR, may be formed. The transmission pattern TP may define or include openings OP. Each of the openings OP may expose at least a portion of the touch sensing layer TDL.

Referring to FIGS. 2, 6, 7 and 8, the photoresist pattern PR and the hard mask HM may be removed. Accordingly, the transmission pattern TP may be exposed.

The openings OP defined by the transmission pattern TP may include first openings OP1 and second openings OP2 as shown in FIG. 8.

The first openings OP1 may extend in the first direction DR1 and may be spaced apart from each other along the second direction DR2. The second openings OP2 may be connected to the first openings OP1, respectively. The second openings OP2 may be spaced apart from each other along the second direction DR2. In an embodiment, a width of the second openings OP2 may be wider than a width of the first openings OP1 in a plan view. Here, each width may be a length of each of the first openings OP1 and the second openings OP2 in the second direction DR2 in a plan view.

Although FIG. 8 illustrates that the second openings OP2 have an elliptical planar shape, the present disclosure is not limited thereto. Each of the second openings OP2 may have various planar shapes such as a polygonal shape, a circular shape, or the like. In addition, each of the second openings OP2 may have various sizes.

The openings OP may overlap the first, second and third light-emitting areas LA1, LA2 and LA3 and the non-light-emitting area NLA. Specifically, the first openings OP1 may overlap portions of the first, second and third light-emitting areas LA1, LA2 and LA3 and the non-light-emitting area NLA. In addition, the second openings OP2 may not overlap the first, second and third light-emitting areas LA1, LA2 and LA3 but may overlap the non-light-emitting area NLA.

The first openings OP1 may overlap one light-emitting area among two light-emitting areas included in each of the first, second and third light-emitting areas LA1, LA2 and LA3. For example, the first openings OP1 may overlap the light-emitting area LA1-1, the light-emitting area LA2-1 and the light-emitting area LA3-1. In addition, the first openings OP1 may not overlap the light-emitting area LA1-2, the light-emitting area LA2-2 and the light-emitting area LA3-2.

Referring to FIGS. 9, 10 and 11, a light blocking material may be injected into the openings OP. The light blocking material may be injected into the openings OP through an inkjet process.

In an embodiment, the light blocking material may be injected into the second openings OP2. In addition, the light blocking material may not be directly injected into the first openings OP1. Since each of the second openings OP2 has a relatively wide width in a plan view, the light blocking material may be easily injected into the second openings OP2. The light blocking material injected into the second openings OP2 may then flow into the first openings OP1 as illustrated in FIG. 11. The light blocking material may fill the first openings OP1 and the second openings OP2. By filling the first openings OP1 and the second openings OP2 with the light blocking material, the first patterns BP1 and the second patterns BP2 may be formed, respectively. Accordingly, the light blocking pattern BP may be formed.

Figure 12:
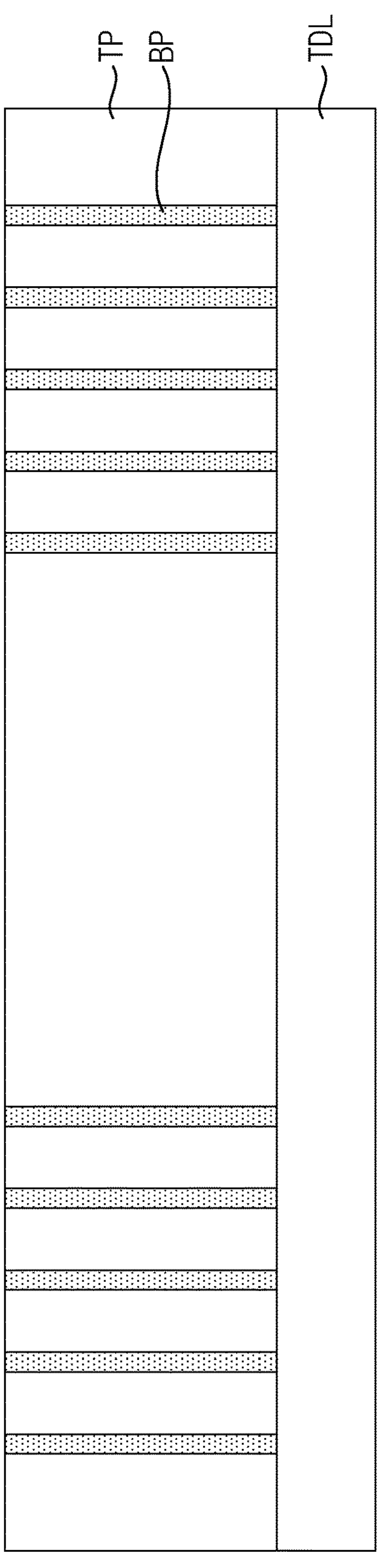
Figure 12:
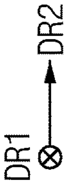

Referring to FIG. 12, the light blocking pattern BP and the transmission pattern TP may be formed on the touch sensing layer TDL. Accordingly, the display device 10 may be manufactured.

Figure 13:
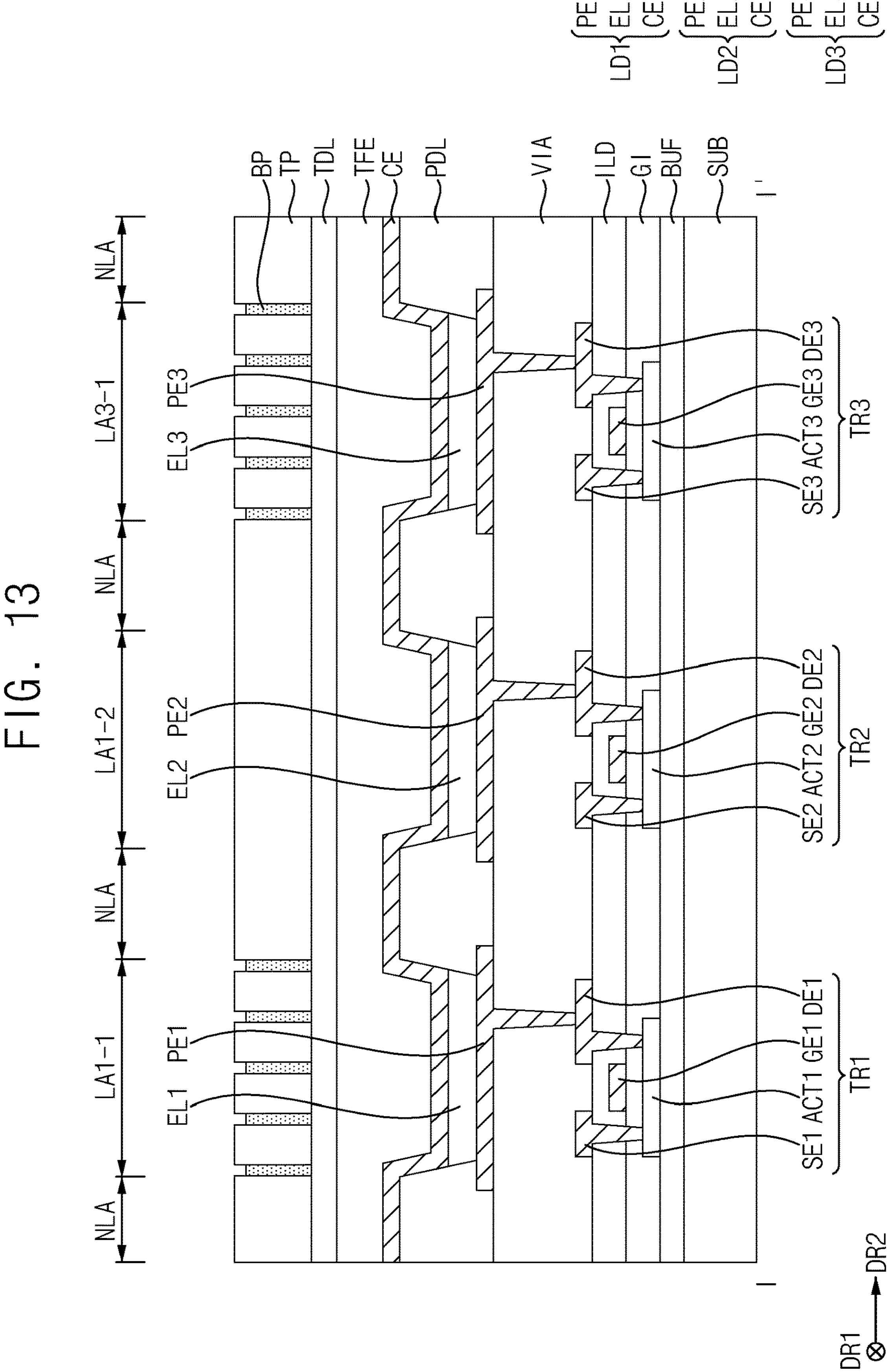
FIG. 13 shows another example of a cross-sectional view taken along line I-I' of FIG. 2.

FIG. 13 shows another example of a cross-sectional view taken along line I-I' of FIG. 2.

Hereinafter, descriptions of structures shown in FIG. 13 that are the same as those of the display device 10 described with reference to FIG. 3 will be omitted or simplified.

Referring to FIGS. 2 and 13, the display device 10 may include the substrate SUB, the buffer layer BUF, the first, second and third transistors TR1, TR2 and TR3, the gate insulating layer GI, the interlayer insulating layer ILD, the via insulating layer VIA, the first, second and third light-emitting elements LD1, LD2 and LD3, the pixel defining layer PDL, the encapsulation layer TFE, the touch sensing layer TDL, the light blocking pattern BP and the transmission pattern TP.

The light blocking pattern BP and the transmission pattern TP may be disposed on the touch sensing layer TDL. The transmission pattern TP may surround the light blocking pattern BP. In an embodiment shown in FIG. 13, the height of the upper surface of the light blocking pattern BP may be lower than the height of the upper surface of the transmission pattern TP.

The display device 10 according to an embodiment of the present disclosure may include the light blocking pattern BP and the transmission pattern TP that control the viewing angle. The light blocking pattern BP may be formed through the inkjet process injecting the light blocking material. Accordingly, the height of the upper surface of the light blocking pattern BP may be adjusted through control of the amount of light-blocking material injected into openings in the transmission pattern TP. In addition, since a chemical mechanical polishing (CMP) process for forming the light blocking pattern BP may be omitted, efficiency of a manufacturing process of the display device 10 may be improved.

Figure 14:
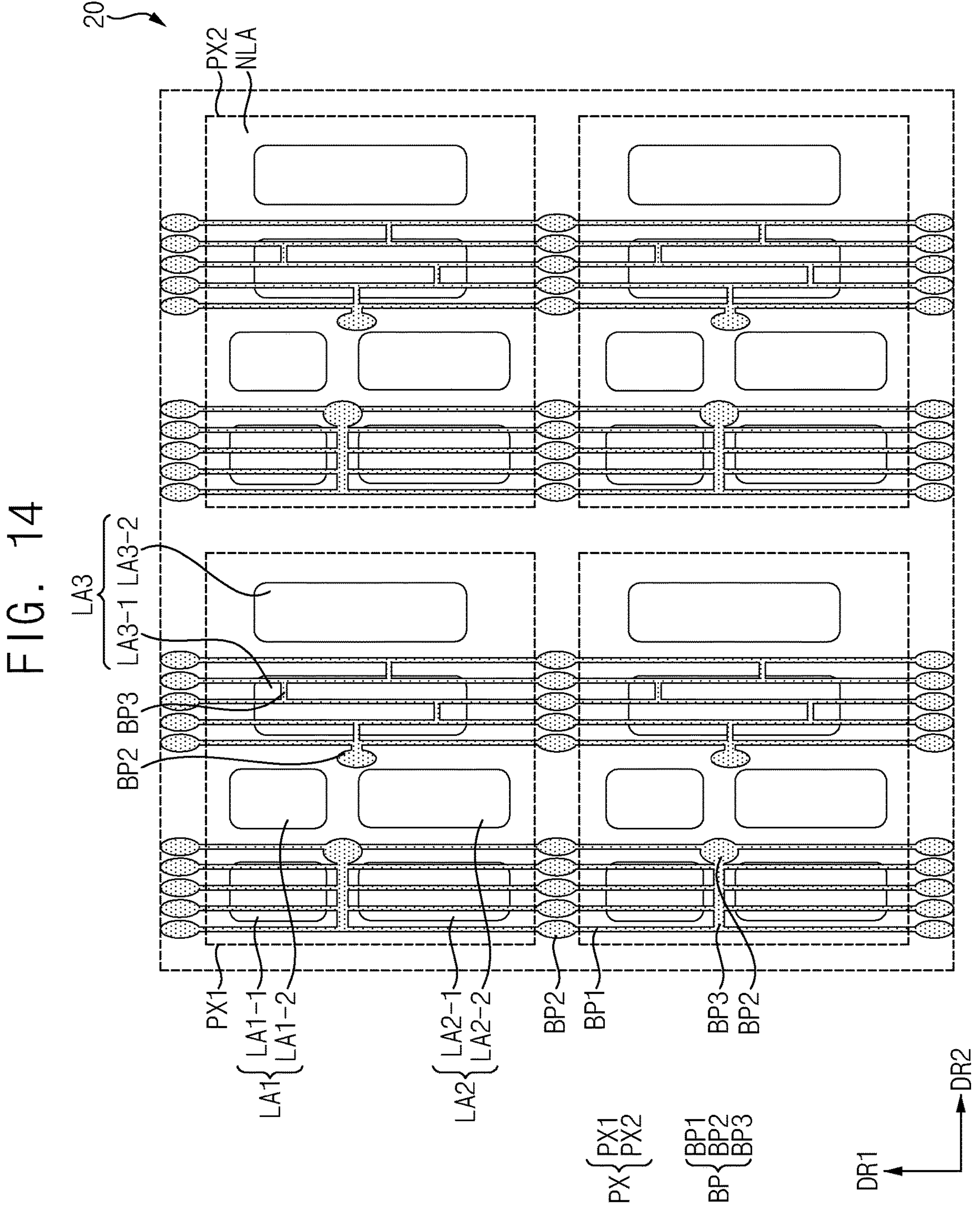
FIG. 14 is a plan view of a display device according to another embodiment of the present disclosure.

FIG. 14 is a plan view illustrating a portion of a display device according to another embodiment of the present disclosure. For example, FIG. 14 may show a plan view corresponding to an alternative for the plan view of FIG. 2.

Hereinafter, descriptions of structures shown in FIG. 14 that are the same as those described with reference to FIG. 2 will be omitted or simplified.

Referring to FIG. 14, a display device 20 may include the pixels PX and the light blocking pattern BP.

The pixels PX may be arranged in rows extending along the first direction DR1 and columns extending along the second direction DR2. Each of the pixels PX may include the first light-emitting area LA1, the second light-emitting area LA2, the third light-emitting area LA3 and the non-light-emitting area NLA.

The first light-emitting area LA1 may include two separate light-emitting regions, particularly the light-emitting area LA1-1 and the light-emitting area LA1-2. The second light-emitting area LA2 may include the light-emitting area LA2-1 and the light-emitting area LA2-2. The third light-emitting area LA3 may include the light-emitting area LA3-1 and the light-emitting area LA3-2.

The light blocking pattern BP of FIG. 14 may include the first patterns BP1, the second patterns BP2 and third patterns BP3.

Each of the first patterns BP1 may extend in the first direction DR1, and the second patterns BP2 may be connected to the first patterns BP1. The third patterns BP3 may extend in the second direction DR2. In addition, the third patterns BP3 may connect first patterns BP1 that are adjacent to each other.

The third patterns BP3 may overlap at least one of the first, second and third light-emitting areas LA1, LA2 and LA3 and the non-light-emitting area NLA. For example, the third patterns BP3 may overlap at least one of the light-emitting area LA1-1, the light-emitting area LA2-1, the light-emitting area LA3-1 and the non-light-emitting area NLA. When the third patterns BP3 overlap at least one of the first, second and third light-emitting areas LA1, LA2 and LA3, the third patterns BP3 may be disposed in consideration of visibility and viewing angle of the display device 10.

FIGS. 15 to 22 shows structures that may be formed during a method of manufacturing the display device of FIG. 14. Among the structures illustrated in FIGS. 15 to 22, FIG. 18 may be an enlarged perspective view of an area C of FIG. 17, FIG. 20 may be an enlarged perspective view of an area D of FIG. 19, and FIG. 21 may be a cross-sectional view taken along line III-III' of FIG. 20.

Hereinafter, descriptions of structures and processes that are the same as in the method of manufacturing the display device 10 described with reference to FIGS. 4 to 12 will be omitted or simplified.

Figure 15:
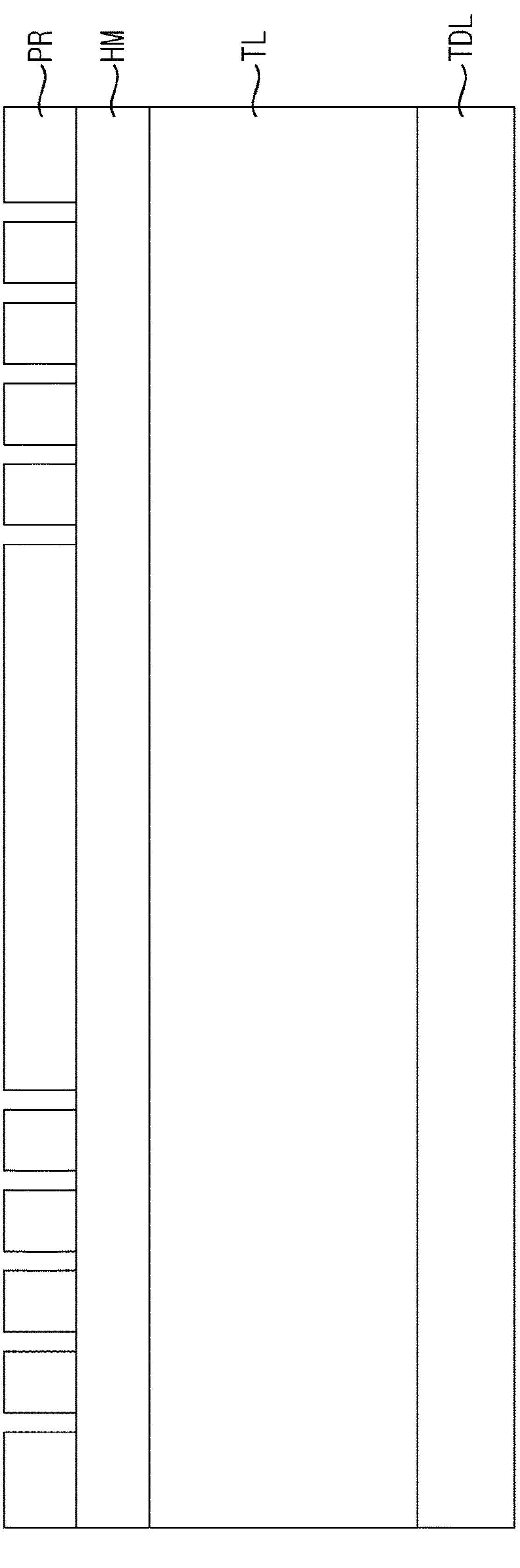
FIGS. 15, 16, 17, 18, 19, 20, 21, and 22 are views illustrating a method of manufacturing of the display device of FIG. 14.
Figure 16:
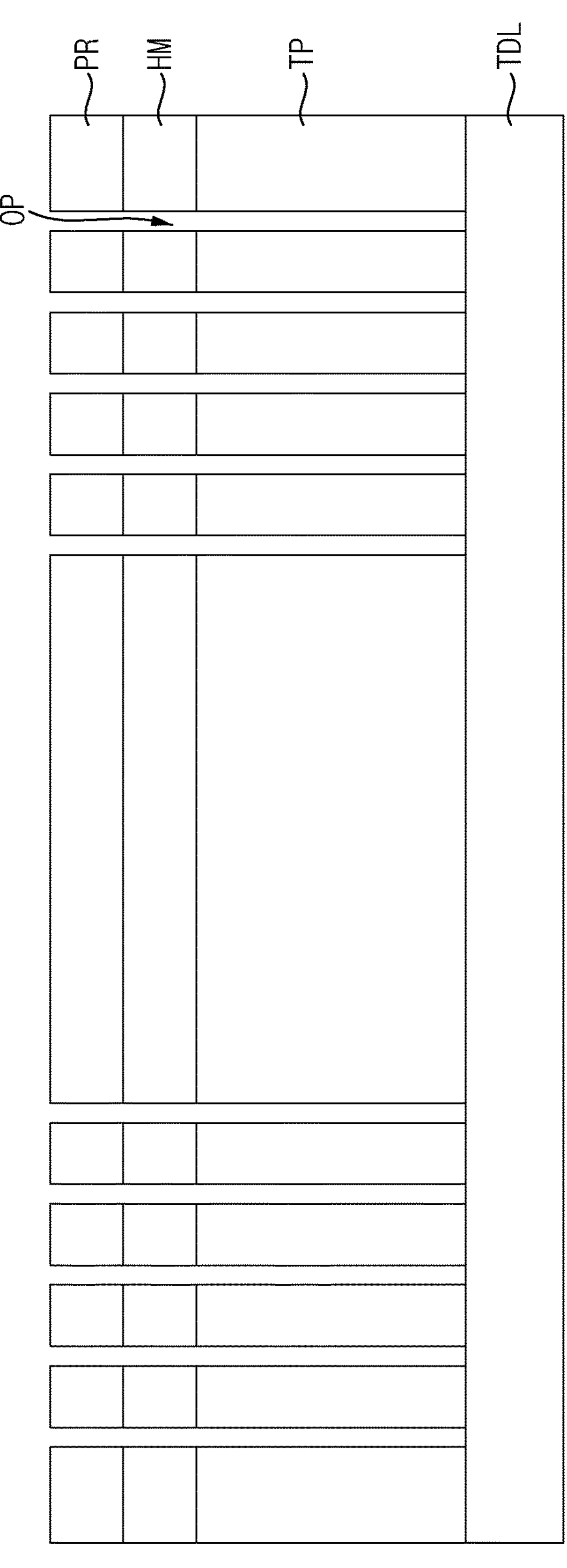
Figure 16:
Figure 17:
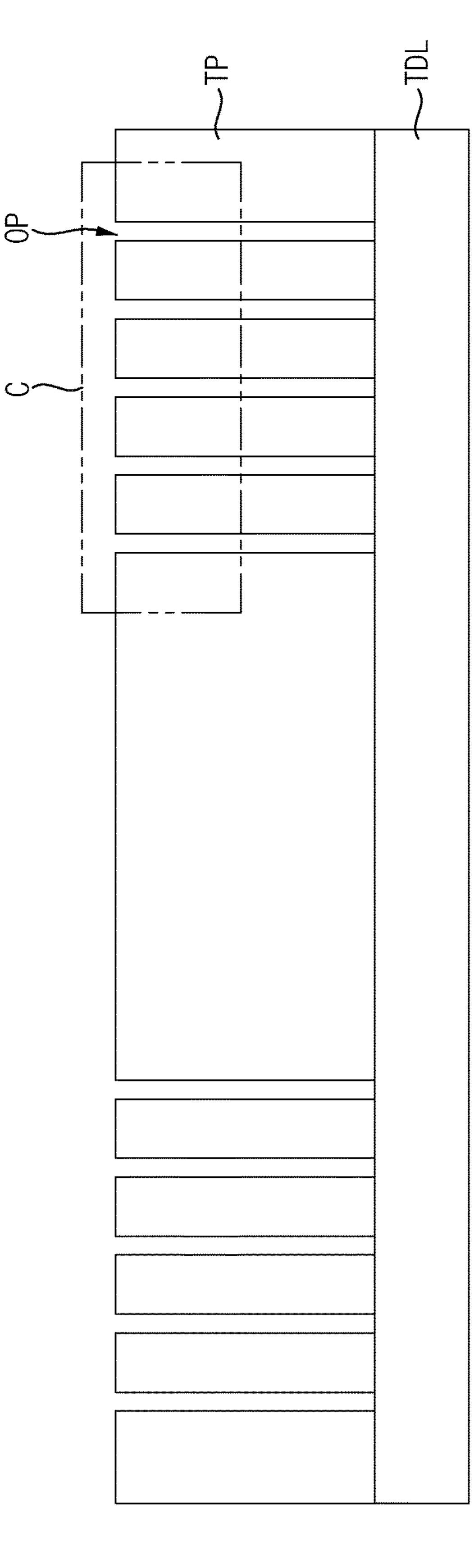
Figure 17:
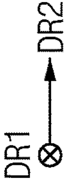
Figure 18:
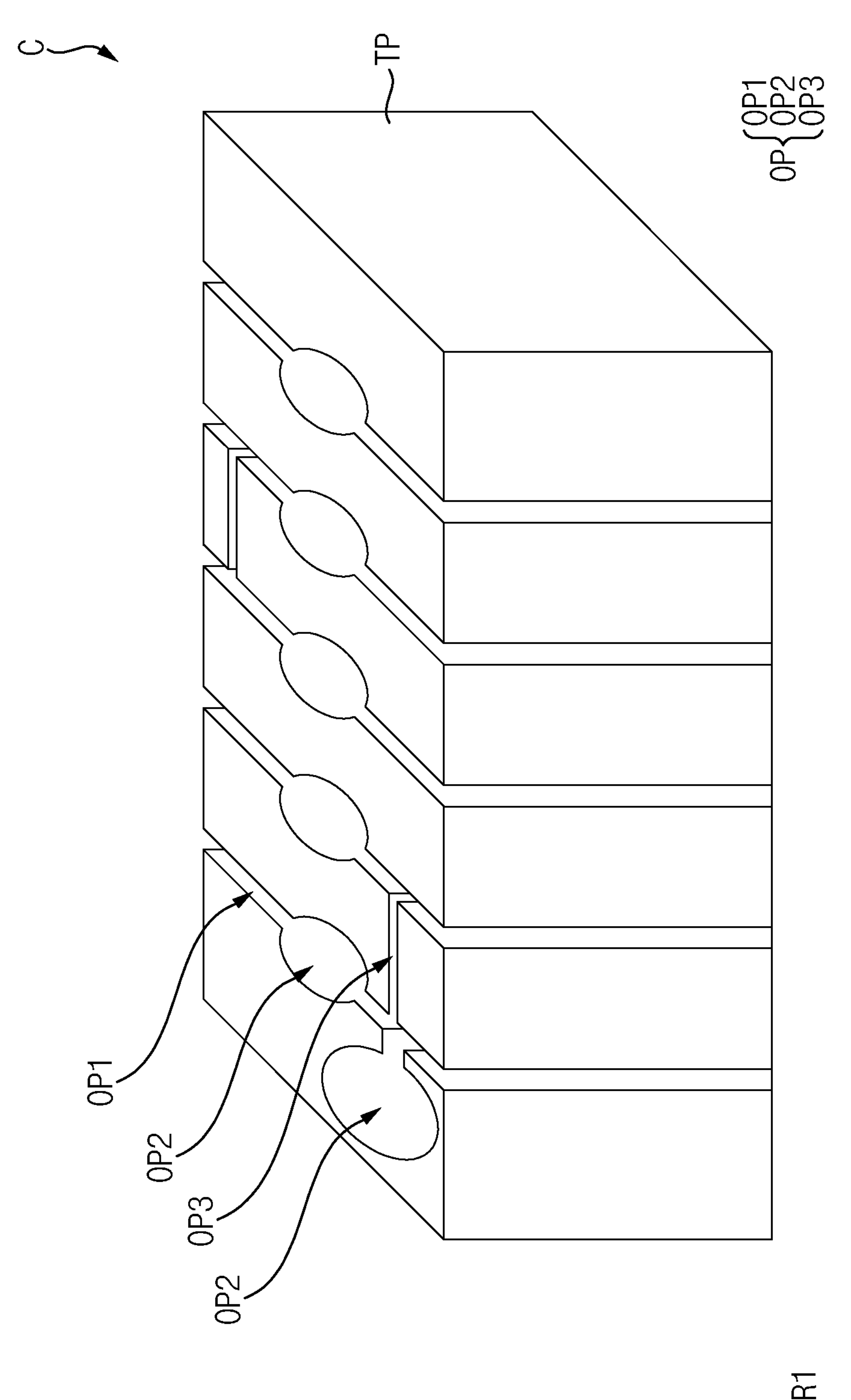

Referring to FIGS. 15 and 16, the transmission layer TL, the hard mask HM and the photoresist pattern PR may be sequentially formed on the touch sensing layer TDL.

The transmission layer TL and the hard mask HM are patterned through the photoresist pattern PR, so that the transmission pattern TP may be formed. The transmission pattern TP may define or include the openings OP.

Referring to FIGS. 14, 16, 17 and 18, the photoresist pattern PR and the hard mask HM may be removed. Accordingly, the transmission pattern TP may be exposed.

The openings OP defined by the transmission pattern TP may include the first openings OP1, the second openings OP2 and third openings OP3.

Each of the first openings OP1 may extend in the first direction DR1, and the second openings OP2 may be connected to the first openings OP1. The third openings OP3 may extend in the second direction DR2. In addition, the third openings OP3 may connect first openings OP1 that are adjacent to each other. The third openings OP3 may overlap at least one of the first, second and third light-emitting areas LA1, LA2 and LA3 and the non-light-emitting area NLA. For example, the third openings OP3 may overlap at least one of the light-emitting area LA1-1, the light-emitting area LA2-1, the light-emitting area LA3-1 and the non-light-emitting area NLA.

Figure 19:
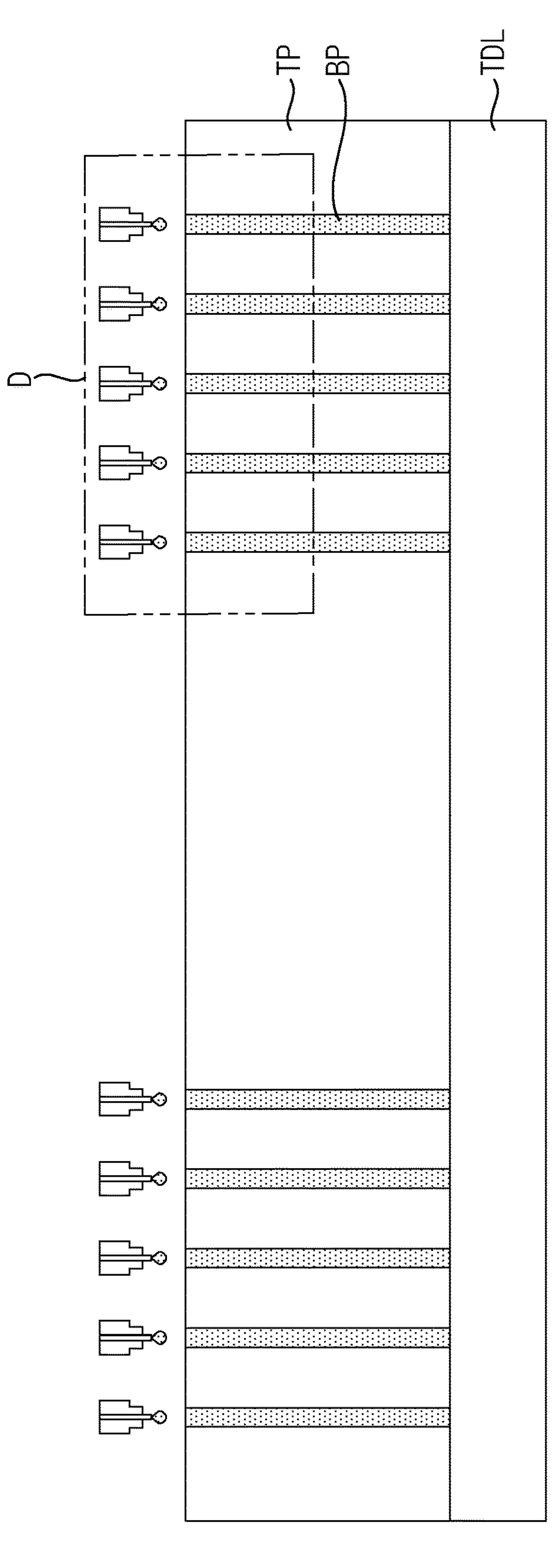
Figure 19:
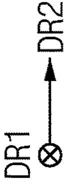
Figure 20:
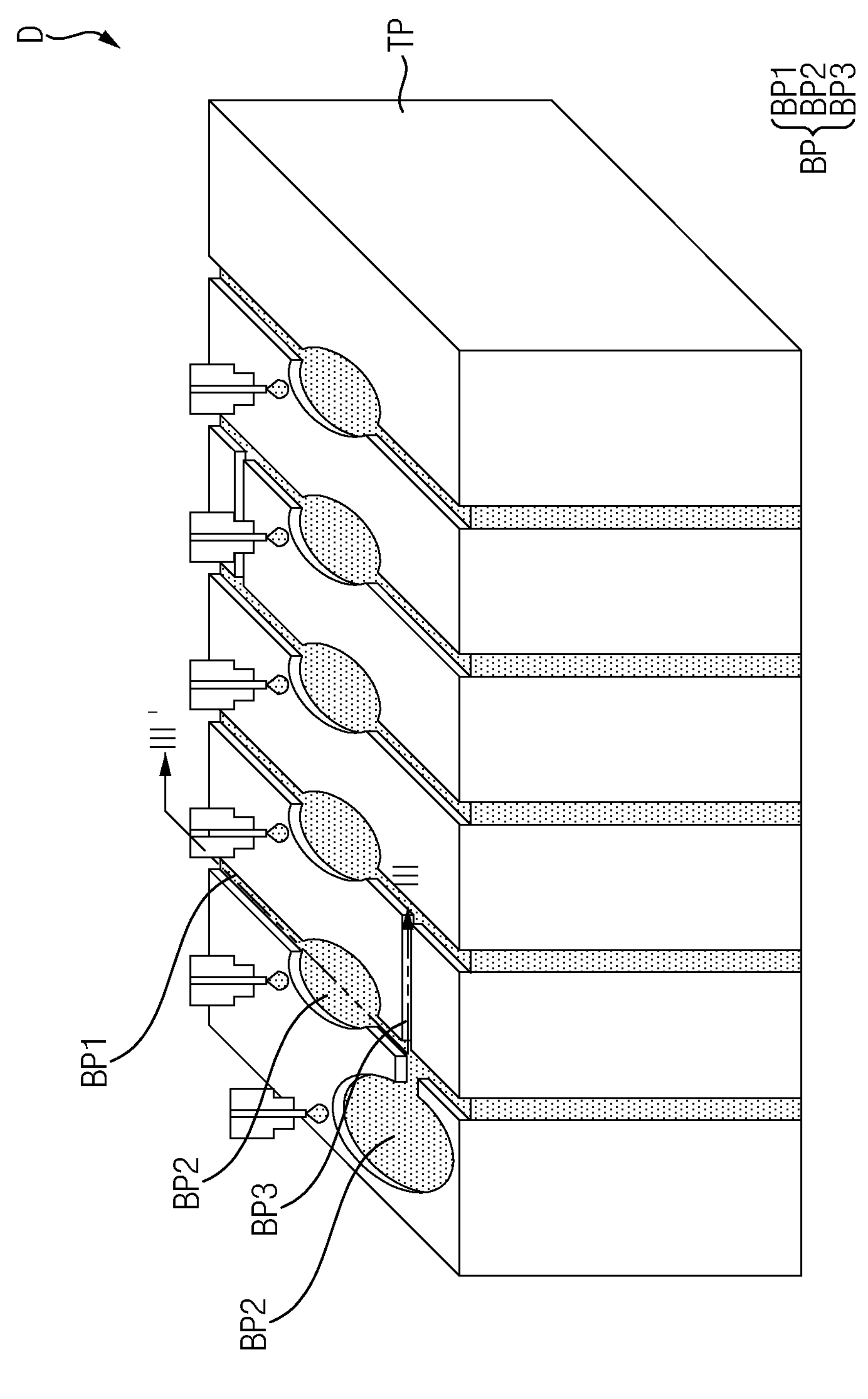
Figure 21:
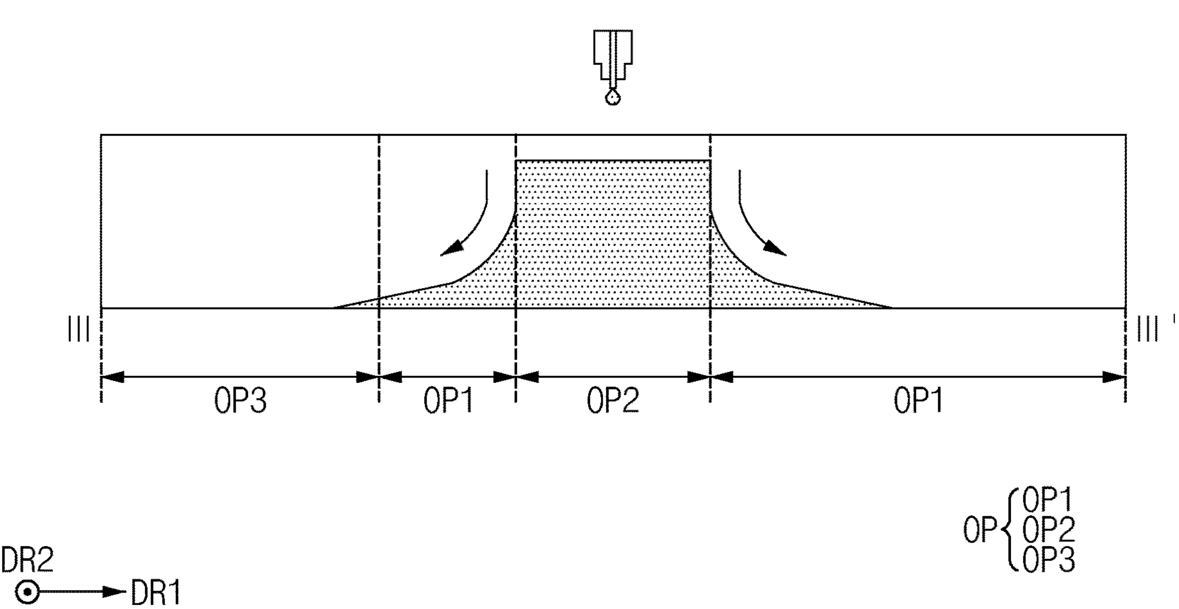

Referring to FIGS. 19, 20 and 21, the light blocking material may be injected into the openings OP. The light blocking material may be injected into the openings OP through an inkjet process.

In an embodiment, the light blocking material may be injected into the second openings OP2. In addition, the light blocking material may not be directly injected into the first openings OP1 and the third openings OP3. The light blocking material injected into the second openings OP2 may flow into the first openings OP1 and the third openings OP3.

The light blocking material may fill the first openings OP1, the second openings OP2 and the third openings OP3. In this case, the third openings OP3 may facilitate the flow of the light blocking material within the openings OP. That is, the third openings OP3 may allow the light blocking material injected into the second openings OP2 to easily fill the openings OP. By filling the first openings OP1, the second openings OP2 and the third openings OP3 with the light blocking material, the first patterns BP1, the second patterns BP2 and the third patterns BP3 may be formed, respectively. Accordingly, the light blocking pattern BP may be formed.

Figure 22:
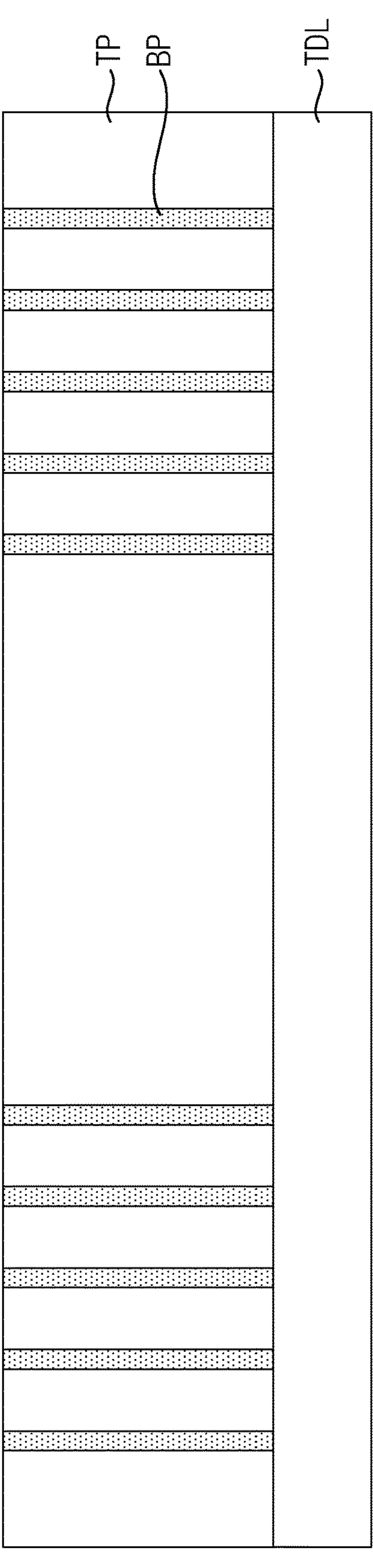
Figure 22:

Referring to FIG. 22, the light blocking pattern BP and the transmission pattern TP may be formed on the touch sensing layer TDL. Accordingly, the display device 20 may be manufactured.

Figure 23:
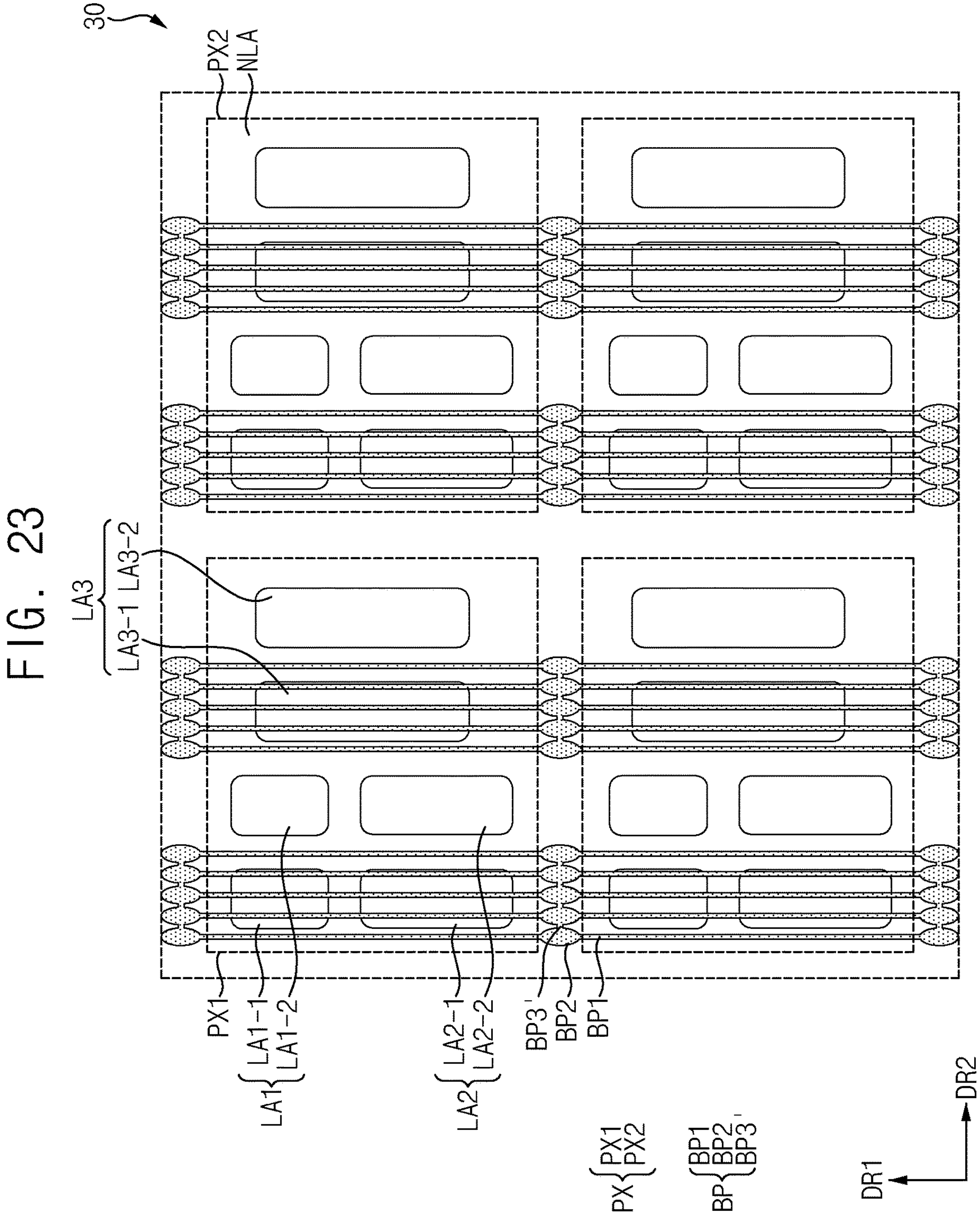
FIG. 23 is a plan view of a display device according to still another embodiment of the present disclosure.

FIG. 23 is a plan view illustrating a display device according to still another embodiment of the present disclosure. For example, FIG. 23 shows a plan view of a display device 30 that may be an alternative to the display device corresponding to the plan view of FIG. 2.

Hereinafter, descriptions of structures or fabrication processes that may be the same as those of the display device 10 described with reference to FIG. 2 will be omitted or simplified.

Referring to FIG. 23, the display device 30 may include the pixels PX and the light blocking pattern BP.

The pixels PX may be arranged columns extending along the first direction DR1 and rows extending along the second direction DR2. Each of the pixels PX may include the first light-emitting area LA1, the second light-emitting area LA2, the third light-emitting area LA3 and the non-light-emitting area NLA.

The first light-emitting area LA1 may include the light-emitting area LA1-1 and the light-emitting area LA1-2. The second light-emitting area LA2 may include the light-emitting area LA2-1 and the light-emitting area LA2-2. The third light-emitting area LA3 may include the light-emitting area LA3-1 and the light-emitting area LA3-2.

The light blocking pattern BP of FIG. 23 may include the first patterns BP1, the second patterns BP2 and third patterns BP3'.

Each of the first patterns BP1 may extend in the first direction DR1, and the second patterns BP2 may be connected to the first patterns BP1, respectively. The third patterns BP3' may extend in the second direction DR2. In addition, the third patterns BP3' may connect second patterns BP2 that are adjacent to each other. The third patterns BP3' may overlap the non-light-emitting area NLA. In addition, the third patterns BP3' may not overlap the first, second and third light-emitting areas LA1, LA2 and LA3.

FIGS. 24 to 31 show structures that may be formed during a method of manufacturing the display device of FIG. 23. Among FIGS. 24 to 31, FIG. 27 may be an enlarged perspective view of area E of FIG. 26, FIG. 29 may be an enlarged perspective view of area F of FIG. 28, and FIG. 30 may be a cross-sectional view taken along line IV-IV' of FIG. 29.

Hereinafter, descriptions structures and processes that may be the same as those of the method of manufacturing the display device 10 described with reference to FIGS. 4 to 12 will be omitted or simplified.

Figure 24:
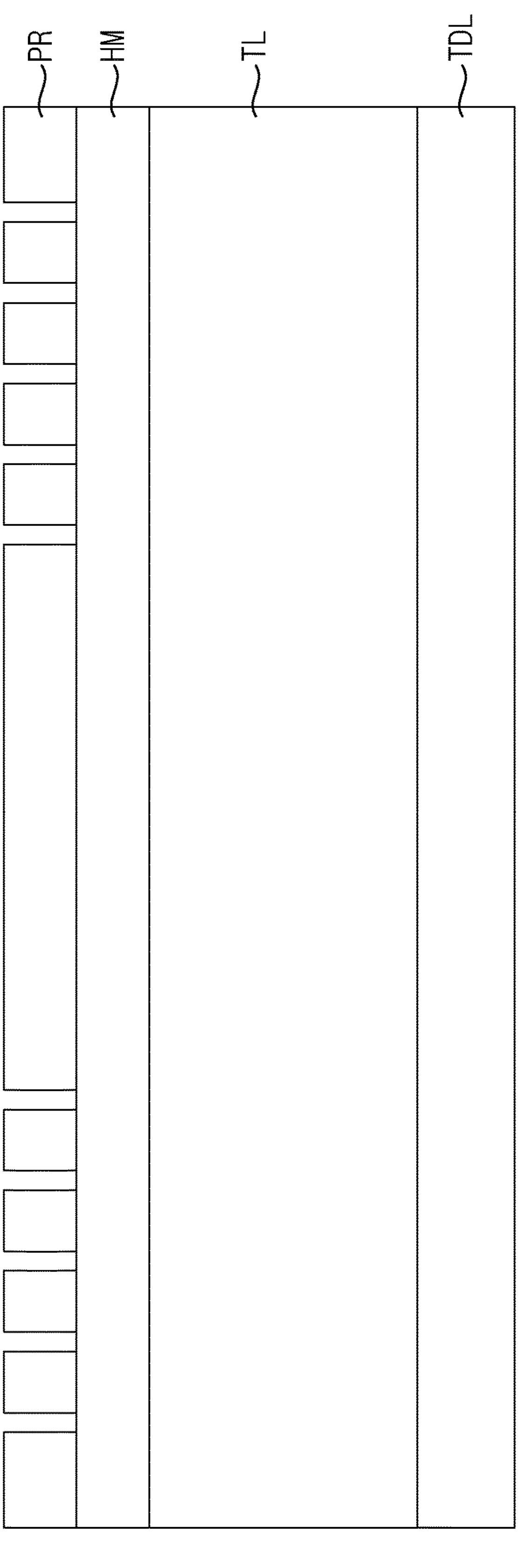
Figure 25:
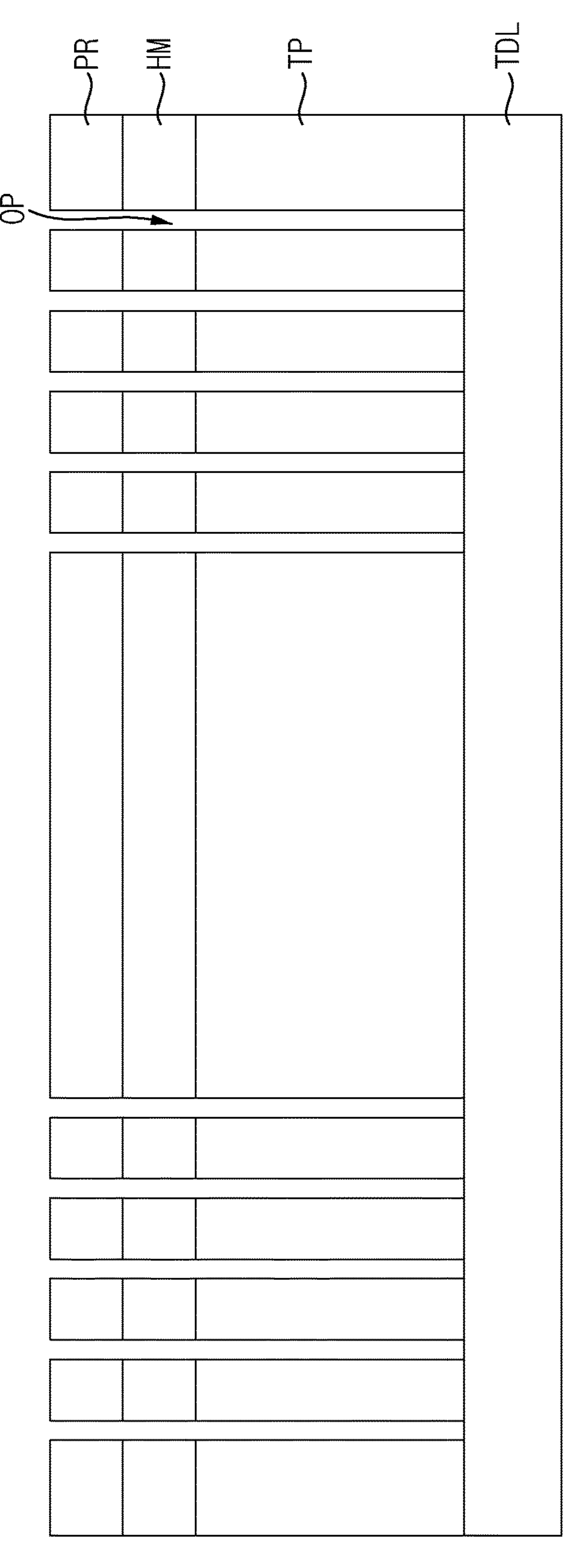
Figure 25:
Figure 27:
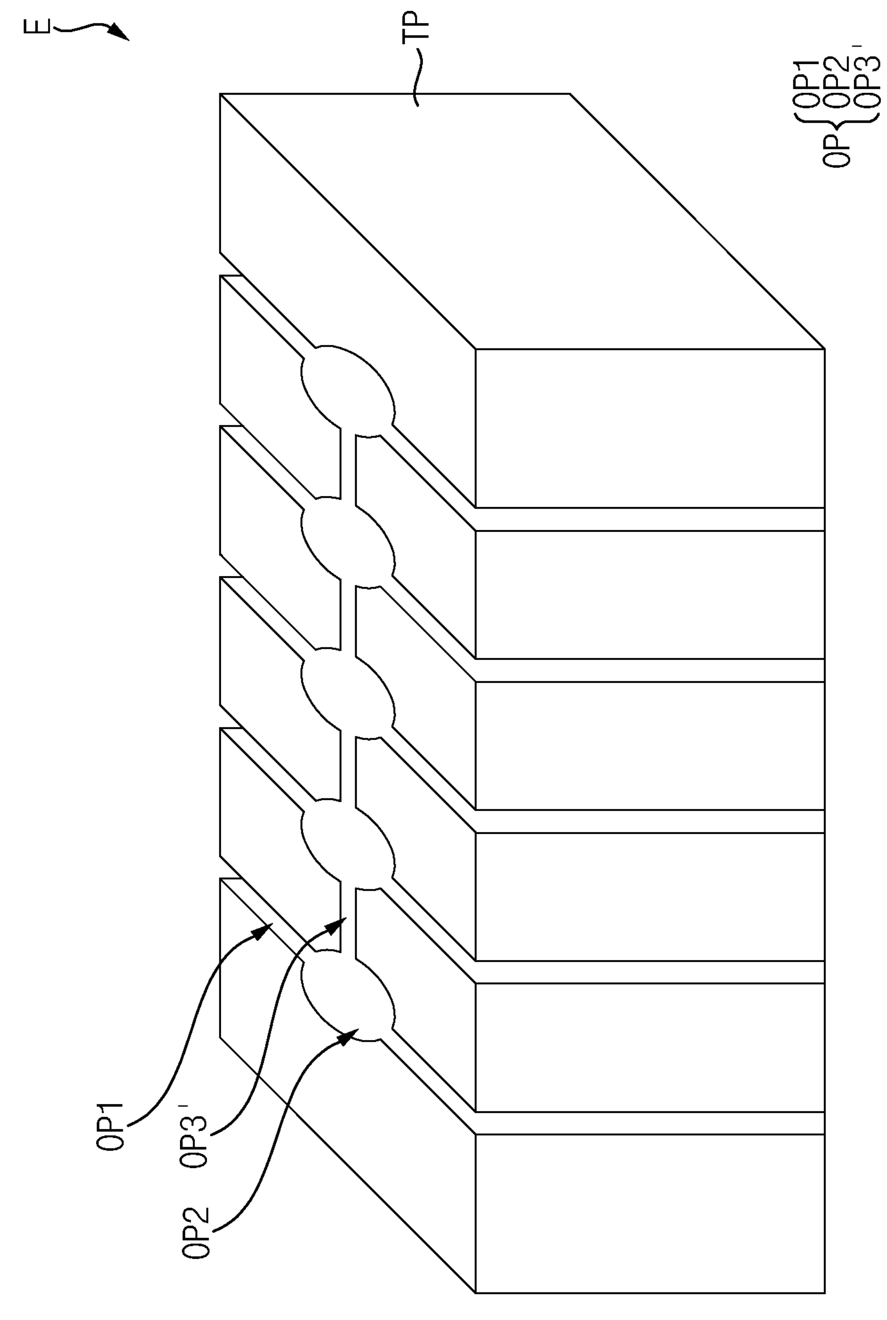
Figure 27:
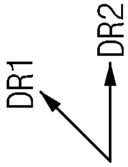

Referring to FIGS. 24 and 25, the transmission layer TL, the hard mask HM and the photoresist pattern PR may be sequentially formed on the touch sensing layer TDL.

The transmission layer TL and the hard mask HM are patterned through the photoresist pattern PR, so that the transmission pattern TP may be formed. The transmission pattern TP may define the openings OP.

Referring to FIGS. 23, 25, 26 and 27, the photoresist pattern PR and the hard mask HM may be removed. Accordingly, the transmission pattern TP may be exposed.

The openings OP defined by the transmission pattern TP may include the first openings OP1, the second openings OP2 and third openings OP3'.

Each of the first openings OP1 may extend in the first direction DR1, and the second openings OP2 may be connected to the first openings OP1, respectively. The third openings OP3' may extend in the second direction DR2. In addition, the third openings OP3' may connect second openings OP2 that are adjacent to each other. The third openings OP3' may overlap the non-light-emitting area NLA. In addition, the third openings OP3' may not overlap the first, second and third light-emitting areas LA1, LA2 and LA3.

Figure 28:
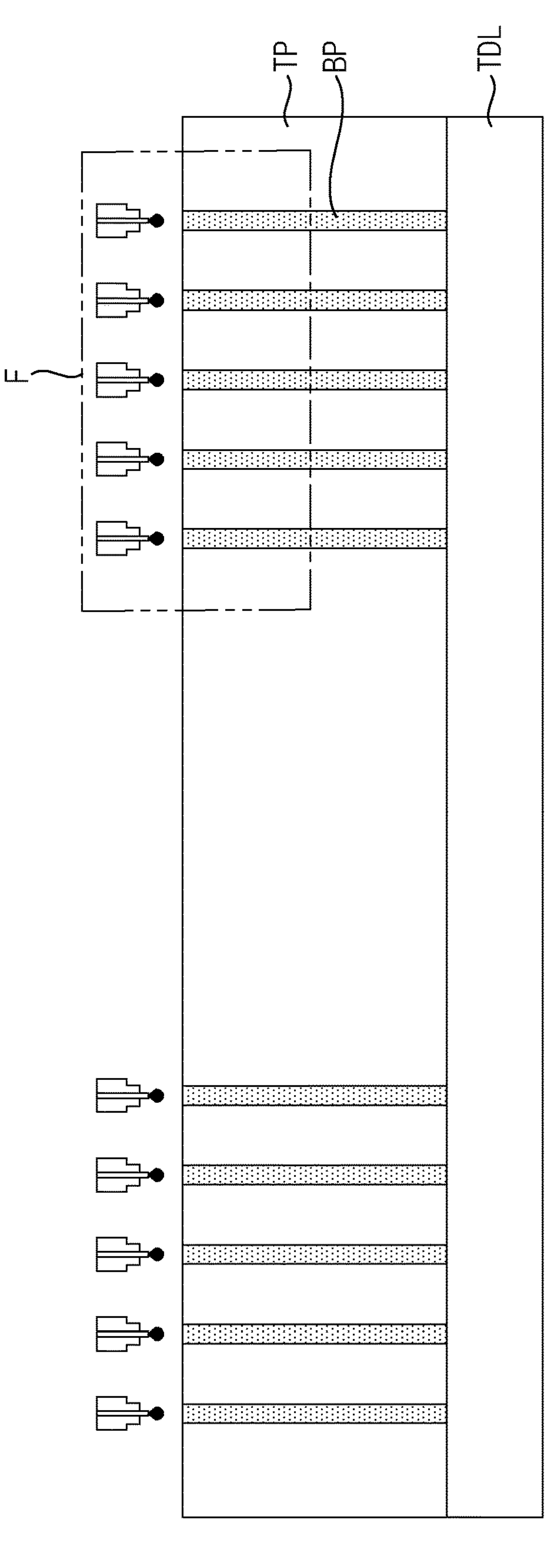
Figure 28:
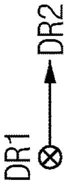
Figure 29:
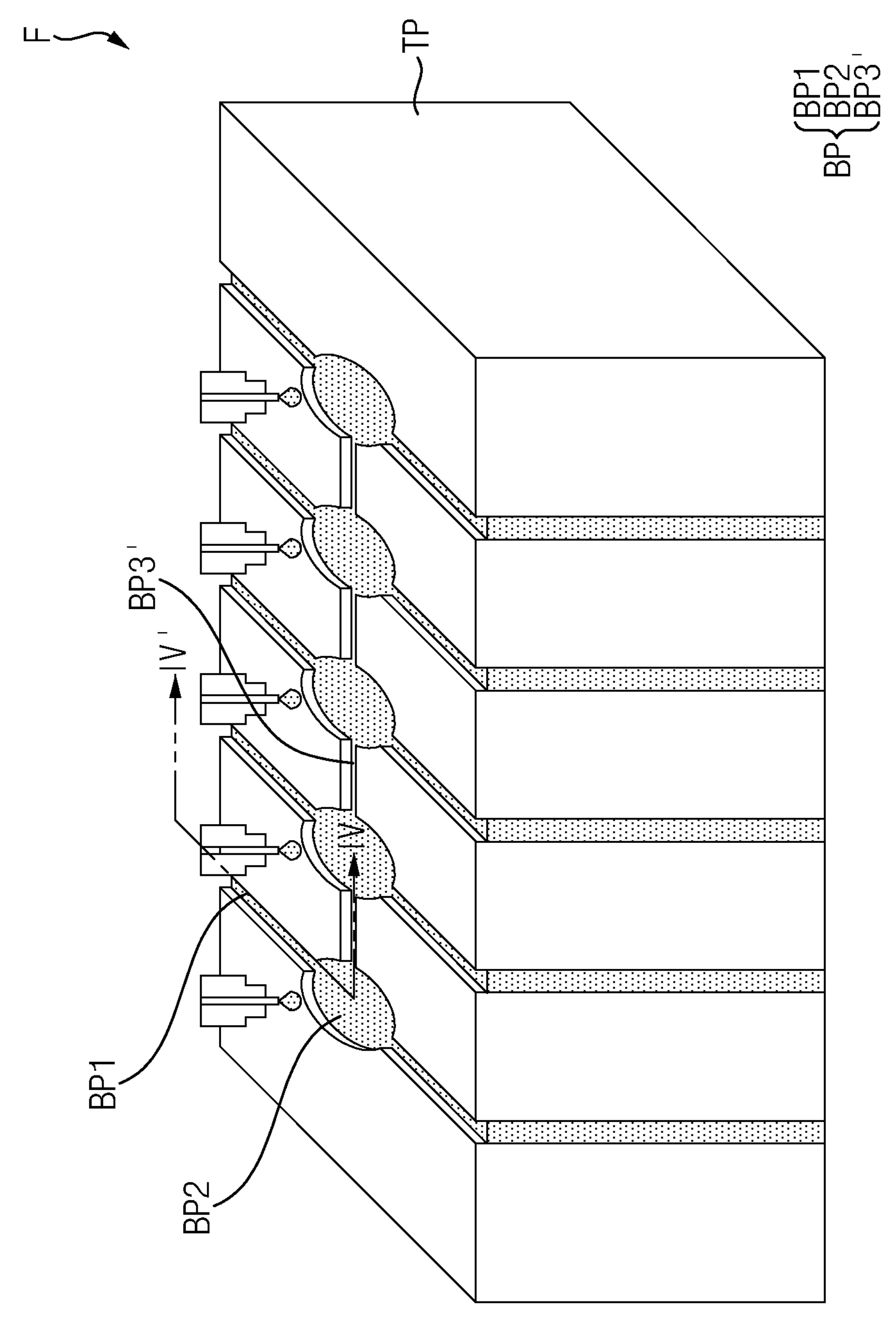
Figure 29:
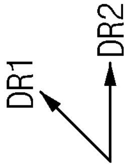
Figure 30:
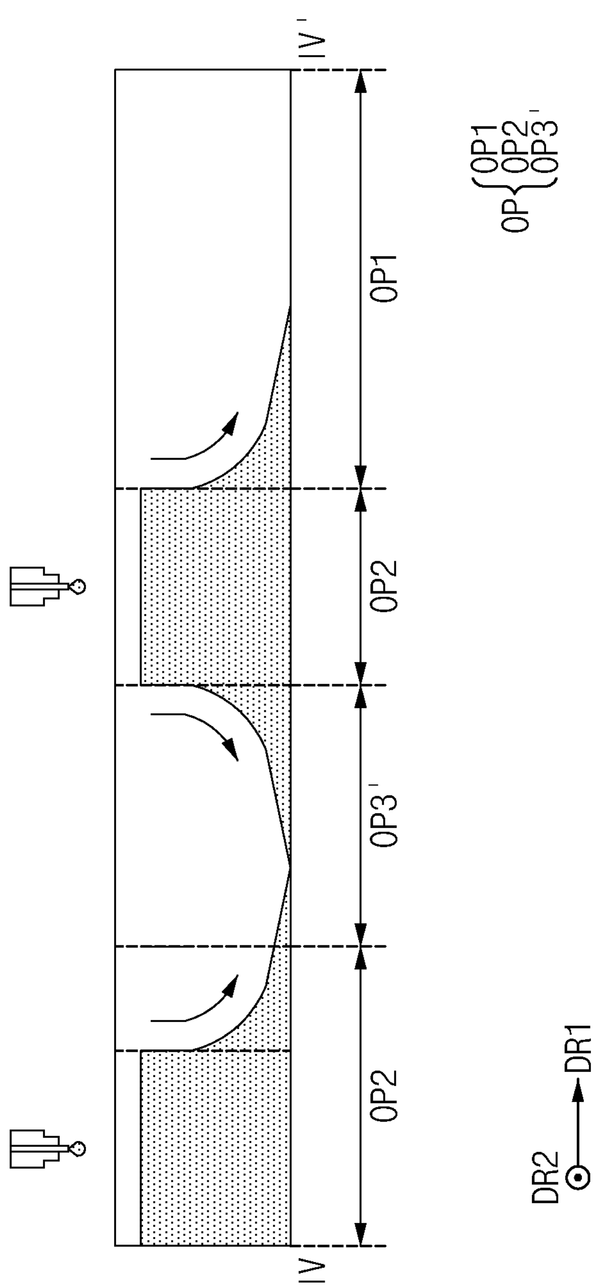

Referring to FIGS. 28, 29 and 30, the light blocking material may be injected into the openings OP. The light blocking material may be injected into the openings OP through an inkjet process.

In an embodiment, the light blocking material may be injected into the second openings OP2. In addition, the light blocking material may not be directly injected into the first openings OP1 and the third openings OP3'. The light blocking material injected into the second openings OP2 may flow into the first openings OP1 and the third openings OP3'.

The light blocking material may fill the first openings OP1, the second openings OP2 and the third openings OP3'. In this case, the third openings OP3' may facilitate the flow of the light blocking material within the openings OP. That is, the third openings OP3' may allow the light blocking material injected into the second openings OP2 to easily fill the openings OP. By filling the first openings OP1, the second openings OP2 and the third openings OP3' with the light blocking material, the first patterns BP1 and the second patterns BP2 and the third patterns BP3' may be formed, respectively. Accordingly, the light blocking pattern BP may be formed.

Figure 31:
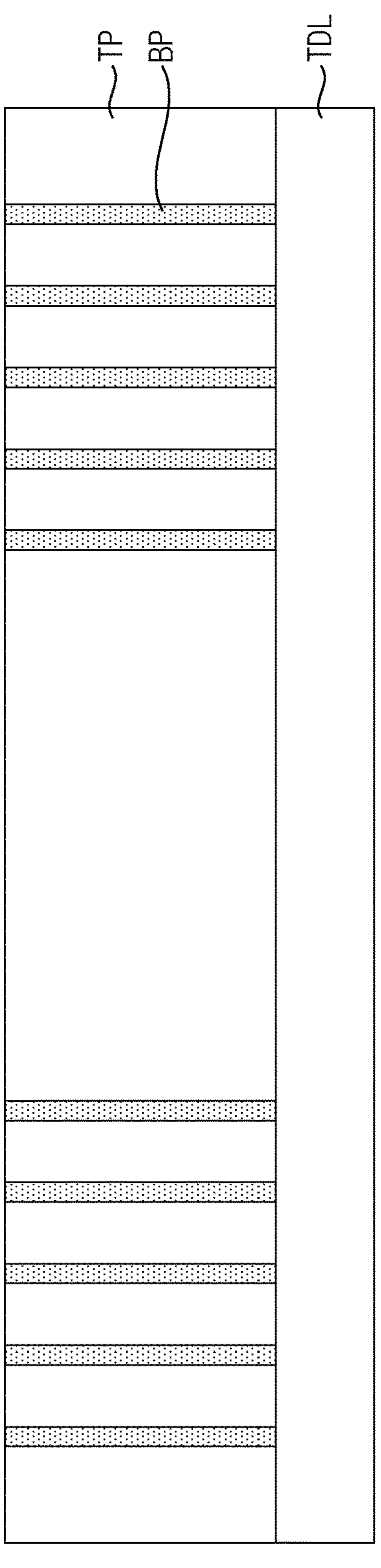
Figure 31:

Referring to FIG. 31, the light blocking pattern BP and the transmission pattern TP may be formed on the touch sensing layer TDL. Accordingly, the display device 30 may be manufactured.

The present disclosure can be applied to various display devices. For example, the present disclosure is applicable to various display devices such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:

a substrate including a light-emitting area and a non-light-emitting area adjacent to the light-emitting area;

a light-emitting element disposed in the light-emitting area on the substrate;

a light blocking pattern disposed on the light-emitting element, and including first patterns extending in a first direction and spaced apart from each other and second patterns connected to the first patterns respectively and having a wider width than the first patterns in a plan view; and a transmission pattern surrounding the light blocking pattern.

2. The display device of claim 1, wherein a height of an upper surface of the light blocking pattern is equal to or lower than a height of an upper surface of the transmission pattern.

3. The display device of claim 1, wherein the first patterns overlap the light-emitting area and the non-light-emitting area.

4. The display device of claim 1, wherein the second patterns do not overlap the light-emitting area and do overlap the non-light-emitting area.

5. The display device of claim 1, wherein the light blocking pattern further includes:

third patterns extending in a second direction intersecting the first direction and connecting the first patterns to each other.

6. The display device of claim 5, wherein the third patterns overlap at least one of the light-emitting area and the non-light-emitting area.

7. The display device of claim 1, wherein the light blocking pattern further includes:

third patterns extending in a second direction intersecting the first direction and connecting the second patterns to each other.

8. The display device of claim 7, wherein the third patterns do not overlap the light-emitting area and do overlap the non-light-emitting area.

9. A method of manufacturing a display device, the method comprising:

forming a light-emitting element on a substrate including a light-emitting area and a non-light-emitting area adjacent to the light-emitting area;

forming a transmission layer on the light-emitting element;

patterning the transmission layer to form a transmission pattern including openings; and injecting a light blocking material into the openings through an inkjet process to form a light blocking pattern.

10. The method device of claim 9, wherein a height of an upper surface of the light blocking pattern is formed to be lower than or equal to a height of an upper surface of the transmission pattern.

11. The method of claim 9, wherein the openings include:

first openings extending in a first direction and spaced apart from each other; and second openings connected to the first openings respectively and having a wider width than the first openings in a plan view.

12. The method of claim 11, wherein the light blocking material is injected into the second openings.

13. The method of claim 12, wherein the light blocking material injected into the second openings flows into the first openings.

14. The method of claim 11, wherein the first openings are formed to overlap the light-emitting area and the non-light-emitting area.

15. The method of claim 11, wherein the second openings are formed not to overlap the light-emitting area and to overlap the non-light-emitting area.

16. The method of claim 11, wherein the openings further include:

third openings extending in a second direction intersecting the first direction and connecting the first openings to each other, and wherein the light blocking material injected into the second openings flows into the first openings and the third openings.

17. The method of claim 16, wherein the third openings are formed to overlap at least one of the light-emitting area and the non-light-emitting area.

18. The method of claim 11, wherein the openings further include:

third openings extending in a second direction intersecting the first direction and connecting the second openings to each other, and wherein the light blocking material injected into the second openings flows into the first openings and the third openings.

19. The method of claim 18, wherein the third openings are formed not to overlap the light-emitting area and to overlap the non-light-emitting area.

20. The method of claim 9, wherein the patterning of the transmission layer comprises:

forming a photoresist pattern on the transmission layer; and etching the transmission layer through the photoresist pattern to form the transmission pattern.

* * * * *